(12) United States Patent
Nishimura et al.

(10) Patent No.: US 7,205,085 B2
(45) Date of Patent: Apr. 17, 2007

(54) COMPOSITION HAVING PERMITIVITY BEING RADIATION-SENSITIVELY CHANGEABLE AND METHOD FOR FORMING PERMITIVITY PATTERN

(75) Inventors: Isao Nishimura, Tokyo (JP); Nobuo Bessho, Tokyo (JP); Atsushi Kumano, Tokyo (JP); Kenji Yamada, Kyoto (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/381,589

(22) PCT Filed: Jul. 25, 2002

(86) PCT No.: PCT/JP02/07561

§ 371 (c)(1),
(2), (4) Date: Apr. 1, 2003

(87) PCT Pub. No.: WO03/012547

PCT Pub. Date: Feb. 13, 2003

(65) Prior Publication Data

US 2004/0005506 A1 Jan. 8, 2004

(30) Foreign Application Priority Data

Aug. 1, 2001 (JP) ............................. 2001-233520

(51) Int. Cl.
*G03F 7/023* (2006.01)

(52) U.S. Cl. ............... 430/190; 430/270.1; 430/905

(58) Field of Classification Search ............... 430/190, 430/192, 193, 270.1, 302, 905
See application file for complete search history.

(56) References Cited

U.S. PATENT DOCUMENTS

| | | | |
|---|---|---|---|
| 3,894,253 A | 7/1975 | Willyoung | |
| 3,940,507 A | 2/1976 | Fech, Jr. et al. | |
| 4,247,611 A | 1/1981 | Sander et al. | |
| 4,889,789 A * | 12/1989 | Stahlhofen | 430/191 |
| 5,084,372 A * | 1/1992 | Hsieh et al. | 430/296 |
| 5,627,010 A | 5/1997 | Pai et al. | |
| 5,958,648 A | 9/1999 | Nishimura et al. | |
| 6,335,141 B1 * | 1/2002 | Watanabe et al. | 430/270.1 |
| 6,338,931 B1 * | 1/2002 | Maeda et al. | 430/170 |
| 6,372,403 B1 * | 4/2002 | Kurisaki et al. | 430/191 |
| 6,399,267 B1 | 6/2002 | Nishimura et al. | |
| 6,746,812 B2 * | 6/2004 | Watanabe et al. | 430/165 |

FOREIGN PATENT DOCUMENTS

| | | |
|---|---|---|
| EP | 0 041 657 | 12/1981 |
| EP | 0 225 454 | 6/1987 |
| EP | 0 284 868 | 10/1988 |
| EP | 0 445 058 | 9/1991 |
| EP | 558280 | 9/1993 |
| EP | 599571 | 6/1994 |
| JP | 45-11712 | 4/1970 |
| JP | 55-9433 | 3/1980 |
| JP | 56-17354 | 2/1981 |
| JP | 57-31674 | 2/1982 |
| JP | 57-040526 | 3/1982 |
| JP | 58-069217 | 4/1983 |
| JP | 60-037549 | 2/1985 |
| JP | 62-136638 | 6/1987 |
| JP | 62-190211 | 8/1987 |
| JP | 63-097945 | 4/1988 |
| JP | 63-268254 | 11/1988 |
| JP | 64-003647 | 1/1989 |
| JP | 02-146544 | 6/1990 |
| JP | 3-107164 | 5/1991 |
| JP | 4-303843 | 10/1992 |
| JP | 04-330444 | 11/1992 |
| JP | 7-056354 | 3/1995 |
| JP | 11-95423 | 4/1999 |
| JP | 2001-142217 | 5/2001 |
| WO | 94/01805 | 1/1994 |
| WO | 02/19034 | 3/2002 |

OTHER PUBLICATIONS

Macromolecules, vol. 29, pp. 5529-5534 1996.
Macromol. Chem. Rapid Commun., vol. , pp. 121-126 1986.
Journal of Polymer Sci, part A-1, vol. 8, pp. 2375-2381 1970.
Macromol. Chem., vol. 179, pp. 1689-1697 1978.
J. Am. Chem. Soc., vol. 54, pp. 1579-1587 1932.
J. Polym. Sci., vol. 28, pp. 343-353 1958.
Macromolecules, vol. 25, pp. 12-17 1992.
Macromolecules, vol. 20, pp. 705-712 1987.
Macromolecules, vol. 21, pp. 1925-1929 1988.
Macromol. Chem., Rapid Commun., vol. 11, pp. 83-88 1990.
Macromol. Chem., Rapid Commun., vol. 5, pp. 151-155 1984.
Macromol. Chem., vol. 189, pp. 2229-2238 1988.
Macromol. Chem., vol. 187, pp. 2525-2533 1986.
Polym. J., vol. 22, pp. 803-813 1990.
J. Polym. Sci., vol. 35, pp. 85-101 1988.
J. Polym. Sci., Polym. Chem. Ed., vol. 22, pp. 1579-1586 1984.
J. Polym. Sci., Polym. Chem. Ed., vol. 14, pp. 655-662 1976.
Polymer, vol. 17, pp. 1086-1090 1976.
M. Dharma-Wardana, "Relation of the Refractive Index to the Dielectric Constant Containing Doppler-Like Spatial Dispersion", Journal of Physics A: General Physics, vol. 9, No. 8, 1976, pp. L93-L97.

* cited by examiner

*Primary Examiner*—John S. Chu
(74) *Attorney, Agent, or Firm*—Oblon, Spivak, McClelland, Maier & Neustadt, P.C.

(57) ABSTRACT

A radiation sensitive dielectric constant changing composition comprising (A) a decomposable compound, (B) a nondecomposable compound, (C) a radiation sensitive decomposer and (D) a stabilizer.

The composition allows its dielectric constant to be changed by a simple method, has a sufficiently large difference between its changed dielectric constant and its original dielectric constant and can provide a dielectric constant pattern and an optical material which are stable regardless of their use conditions.

10 Claims, No Drawings

COMPOSITION HAVING PERMITIVITY BEING RADIATION-SENSITIVELY CHANGEABLE AND METHOD FOR FORMING PERMITIVITY PATTERN

FIELD OF THE INVENTION

The present invention relates to a radiation sensitive dielectric constant changing composition, a method of forming a dielectric constant pattern, a dielectric constant pattern and a device having a dielectric constant pattern. More specifically, it relates to a novel radiation sensitive dielectric constant changing composition which can provide a dielectric constant pattern for use as an insulating material or a capacitor for circuit boards, a method of forming a dielectric constant pattern, a dielectric constant pattern and a device having a dielectric constant pattern.

DESCRIPTION OF THE PRIOR ART

Technical development for reducing the length of wiring, the dielectric constant of an interlayer film and the length of a gate is now under way in order to increase the speed of a semiconductor. The field of packaging technology for creating a system usable state while retaining the performance of a semiconductor is far behind the above development. Packaging structures are now being reviewed to catch up with the above development. For example, attempts are being made to reduce the length of wiring and the dielectric constant of an interlayer film in the field of packaging technology.

In conventional packaging technology, the performance of a memory IC is maintained by placing a path capacitor or input/output capacitor near an IC terminal. However, there arises the need of placing these elements near an element to increase the speed, and studies on how to bring a passive element, which has been positioned away from an IC, as close to the IC as possible to reduce the length of wiring so as to increase the speed are now under way. As a result, attention is now paid to a substrate structure such as "embedded passive".

In the above packaging technology, in order to form a distribution having a difference between two different dielectric constants, one material is first formed, followed by the deposition of another material having a different dielectric constant on the entire surface of the above material. Thereafter, an unrequired deposited portion is removed by etching after patterning with a photosensitive material. Since this method has a large number of steps and the obtained film is apt to greatly vary in thickness, a material which provides a film having high uniformity in thickness is desirably used as the material on which another material is deposited.

As the integration becomes higher, a lower dielectric constant material is needed for an interlayer insulating film used to prevent a delay caused by cross talk between wirings in the assembly of a highly intergrated circuit. To this end, studies on the reduction of dielectric constant using organic and inorganic materials are now under way. As one of the studies, the reduction of dielectric constant using porous materials has been reported in Mat. Res. Soc. Symp. Proc., Vol. 511, 105 (1998); Electrochemical and Solid-State letters, Vol. 2, 77 (1999); Proc. DUMIC Santa Clara, 25 (1998); collection of drafts for the 61st lecture meeting of the Applied Physics Society, 4a-P4-20 (2000); collection of drafts for the 61st lecture meeting of the Applied Physics Society, 4a-P4-27 (2000); Proc. of the 2000 IITC, 143 (2000) and the like. A reduction in density by using a porous material makes it possible to form a film having a dielectric constant of 2 or less. However, since a reduction in the density of a film has a direct influence on the reduction of the strength of the film although it reduces the dielectric constant of the film, the development of an interlayer insulating film having higher strength than a conventional interlayer insulating film is desired.

Meanwhile, studies on the reduction of the capacity of wiring by employing a hollow structure containing air which has the lowest dielectric constant as the structure of a highly integrated circuit have been reported by JP-A 63-268254 (the term "JP-A" as used herein means an "unexamined published Japanese patent application"); Microprocessor report, August 4, 14 (1997); Symp. On VLSI Technology, 82 (1996); DUMIC Conference, 139 (1997); IEEE Electron Device Letters, Vol. 19, No. 1, 16 (1998) and the like. However, this hollow structure involves many problems in its process, for example, extremely high accuracy required for assembly and therefore is not implemented yet.

SUMMARY OF THE INVENTION

The present invention has been made in view of the above situation in the prior art.

That is, it is an object of the present invention to provide a radiation sensitive dielectric constant changing composition whose dielectric constant can be changed by a simple method and which has a sufficiently large difference between its changed dielectric constant and its original dielectric constant and which can provide a dielectric constant pattern which is stable regardless of its use conditions.

It is another object of the present invention to provide a radiation sensitive dielectric constant changing composition which provides a dielectric constant pattern having a large number of pores formed by exposure to radiation and maintained stably, and having high strength in spite of having the large number of pores.

It is still another object of the present invention to provide a method of forming a dielectric constant pattern from the above composition of the present invention.

It is a further object of the present invention to provide a dielectric constant pattern produced by the above method of the present invention or a device having the dielectric constant pattern.

Other objects and advantages of the present invention will become apparent from the following description.

According to the present invention, firstly, the above objects and advantages of the present invention are attained by a radiation sensitive dielectric constant changing composition comprising (A) a decomposable compound, (B) a nondecomposable compound, (C) a radiation sensitive decomposer and (D) a stabilizer.

According to the present invention, secondly, the above objects and advantages of the present invention are attained by a method of forming a dielectric constant pattern, comprising the steps of exposing a radiation sensitive dielectric constant changing composition comprising (A) a decomposable compound, (B) a nondecomposable compound, (C) a radiation sensitive decomposer and (D) a stabilizer to radiation and heating it to react the stabilizer (D) with the decomposable compound (A).

According to the present invention, thirdly, the above objects and advantages of the present invention are attained by a method of forming a dielectric constant pattern, comprising the steps of exposing a dielectric constant changing material comprising (A) a decomposable compound, (B) a nondecomposable compound and (C) a radiation sensitive decomposer to radiation and treating it with (D) a stabilizer.

According to the present invention, in the fourth place, the above objects and advantages of the present invention are attained by a method of forming a dielectric constant pattern, comprising the steps of exposing a dielectric constant changing material comprising (A) a decomposable compound, (B) a nondecomposable compound and (C) a radiation sensitive decomposer to radiation through a pattern mask and heating it to decompose the decomposable compound in an unexposed portion.

According to the present invention, in the fifth place, the above objects and advantages of the present invention are attained by a dielectric constant pattern formed by the above method of forming a dielectric constant pattern.

According to the present invention, in the sixth place, the above objects and advantages of the present invention are attained by a device having the above dielectric constant pattern.

In the present invention, the term "dielectric constant pattern" as used herein means a dielectric constant distribution material consisting of regions having different dielectric constants.

Each of the components of the dielectric constant changing material used in the method of forming a dielectric constant pattern of the present invention will be described in detail hereinunder.

(A) Decomposable Compound

The decomposable compound (A) used in the present invention can be an acid decomposable compound or a base decomposable compound.

The acid decomposable compound is selected from compounds having at least one of structures represented by the following formulas (1) to (6) and (10). These compounds may be used alone or in combination of two or more.

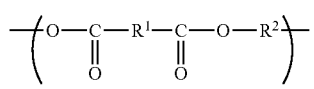
(1)

(In the formula (1), $R^1$ is an alkylene group, alkylene-arylene-alkylene group or arylene group, and $R^2$ is an alkylene group, alkylene-arylene-alkylene group, arylene group, alkylsilylene group or alkylgermylene group.)

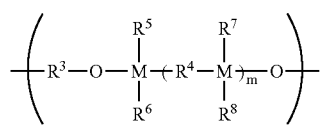
(2)

(In the formula (2), M is Si or Ge, $R^3$ is an alkylene group, alkylene-arylene-alkylene group, arylene group, alkylsilylene group or alkylgermylene group, $R^4$ is an oxygen atom, alkylene group, alkylene-arylene-alkylene group, arylene group or single bond, $R^5$, $R^6$, $R^7$ and $R^8$ are each independently a hydrogen atom, alkyl group, aryl group, alkoxy group or thioalkyl group, and m is an integer of 0 to 2.)

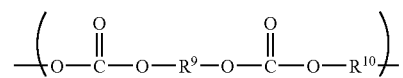
(3)

(In the formula (3), $R^9$ and $R^{10}$ are each independently an alkylene group, alkylene-arylene-alkylene group, arylene group, alkylsilylene group or alkylgermylene group.)

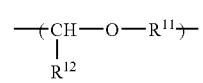
(4)

(In the formula (4), $R^{11}$ is an oxyalkylene group or single bond, and $R^{12}$ is a hydrogen atom, alkyl group, alkylene-arylene-alkylene group or aryl group.)

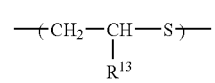
(5)

(In the formula (5), $R^{13}$ is a hydrogen atom, alkyl group or aryl group.)

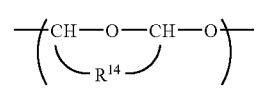
(6)

(In the formula (6), $R^{14}$ is an alkylene group or a structure represented by the following formula (7), (8) or (9).)

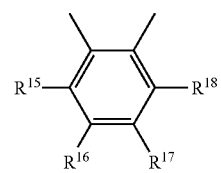
(7)

(In the formula (7), $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms.)

(8)  —O—$R^{19}$—O—

(In the formula (8), $R^{19}$ is an alkylene group.)

$$—NH—R^{20}—NH— \quad (9)$$

(In the formula (9), $R^{20}$ is an alkylene group.)

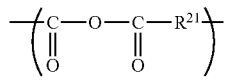

(In the formula (10), $R^{21}$ is an alkylene group, alkylene-arylene-alkylene group or arylene group.)

The acid decomposable compounds having structures represented by the above formulas (1) to (6) and (10) are decomposed by an acid generated from a radiation sensitive acid decomposer upon exposure to radiation. A low-molecular weight compound formed by decomposition is a compound such as a carbonic acid gas which is gaseous at normal temperature or a compound which can evaporate or sublime as a gas when it is treated at an increased temperature. After the dissipation of the gas, pores are formed.

As the acid decomposable compound (A) may be used (i) a phenolic resin having at least two phenolic hydroxyl groups and at least two phenyl groups in the molecule, at least one of the phenolic hydroxyl groups forming a naphthoquinonediazidosulfonyl ester group such as 1,2-naphthoquinonediazido-5-sulfonyl ester group, (ii) a novolak resin having at least one phenolic hydroxyl group forming a naphthoquinonediazidosulfonyl ester group such as 1,2-naphthoquinonediazido-5-sulfonyl ester group, (iii) a phenolic resin having at least two phenolic hydroxyl groups and at least two phenyl group in the molecule, at least one of the phenolic hydroxyl groups being protected by an acid decomposable protective group, (iv) a novolak resin having at least one phenolic hydroxyl group protected by an acid decomposable protective group, and (v) a carboxyl group-containing resin having at least one carboxyl group protected by an acid decomposable protective group.

These resins (i) to (v) may be used alone or in combination of two or more.

The above acid decomposable compounds (i) to (v) are decomposed by an acid generated from a radiation sensitive acid decomposer upon exposure to radiation to form a phenolic resin, novolak resin or carboxyl group-containing resin all of which are alkali-soluble resins. These formed alkali-soluble resins are removed by extraction with an alkali aqueous solution and pores are formed after extraction. Therefore, since extraction with an alkali aqueous solution is carried out when any one of the acid decomposable compounds (i) to (v) is used as the component (A), a polymer insoluble in an alkali aqueous solution, e.g., a polymer having no carboxyl group or phenolic hydroxyl group is preferably used as the component (B), namely, an acid nondecomposable compound.

The base decomposable compound is selected from compounds having at least one of structures represented by the following formulas (11) to (13) and (14). These compounds may be used alone or in combination of two or more.

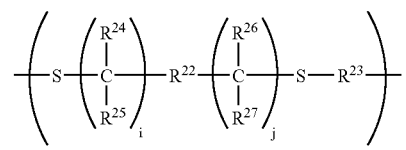

(In the formula (11), $R^{22}$ is an alkylene group, aralkylene group or arylene group, $R^{23}$ is an alkylene group, aralkylene group, arylene group, alkylene-arylene-alkylene group, alkylsilylene group or alkylgermylene group, $R^{24}$, $R^{25}$, $R^{26}$ and $R^{27}$ are each independently a hydrogen atom, alkyl group, aryl group, alkoxyl group or thioalkyl group, and i and j are each independently 0 or 1.)

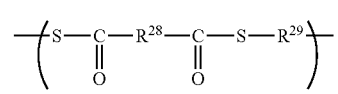

(In the formula (12), $R^{28}$ is an alkylene group, aralkylene group or arylene group, and $R^{29}$ is an alkylene group, aralkylene group, arylene group, alkylene-arylene-alkylene group, alkylsilylene group or alkylgermylene group.)

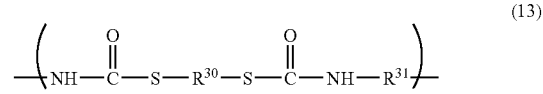

(In the formula (13), $R^{30}$ and $R^{31}$ are each independently an alkylene group, aralkylene group, arylene group, alkylene-arylene-alkylene group, alkylsilylene group or alkylgermylene group.)

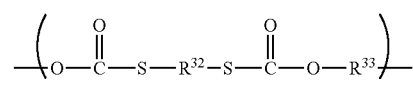

(In the formula (14), $R^{32}$ and $R^{33}$ are each independently an alkylene group, aralkylene group, arylene group, alkylene-arylene-alkylene group, alkylsilylene group or alkylgermylene group.)

All the above alkylene-arylene-alkylene groups each independently have a structure represented by the following formula (15) or (16):

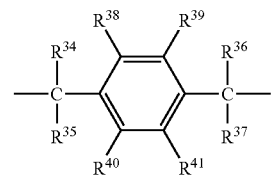

(In the formula (15), $R^{34}$, $R^{35}$, $R^{36}$ and $R^{37}$ are each independently a hydrogen atom, chain alkyl group having 1 to 6 carbon atoms or aryl group having 6 to 10 carbon atoms, and $R^{38}$, $R^{39}$, $R^{40}$ and $R^{41}$ are each independently a hydrogen atom, chlorine atom, bromine atom, hydroxyl group, mercapto group, alkoxyl group, thioalkyl group, alkylester group, alkylthioester group, aryl group, cyano group or nitro group.)

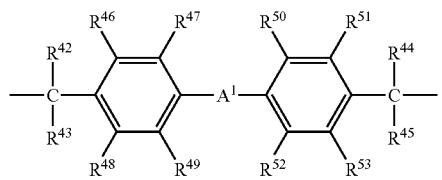

(16)

(In the formula (16), $R^{42}$, $R^{43}$, $R^{44}$ and $R^{45}$ are each independently a hydrogen atom, chain alkyl group having 1 to 6 carbon atoms or aryl group having 6 to 10 carbon atoms, $R^{46}$, $R^{47}$, $R^{48}$, $R^{49}$, $R^{50}$, $R^{51}$, $R^{52}$ and $R^{53}$ are each independently a hydrogen atom, chlorine atom, bromine atom, hydroxyl group, mercapto group, alkoxyl group, thioalkyl group, alkylester group, alkylthioester group, aryl group, cyano group or nitro group, and $A^1$ is —S—, —O—, —SO$_2$—, —CO—, —COO—, —OCOO—, —CH$_2$— or —C($R^{54}$)$_2$— ($R^{54}$ is a chain alkyl group having 1 to 6 carbon atoms.)

All the above arylene groups each independently have a structure represented by the following formula (17):

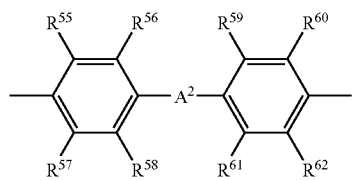

(17)

wherein $R^{55}$ to $R^{62}$ are each independently a hydrogen atom, chlorine atom, bromine atom, hydroxyl group, mercapto group, alkoxyl group, thioalkyl group, alkylester group, alkylthioester group, aryl group, cyano group or nitro group, and $A^2$ is —S—, —O—, —SO$_2$—, —CO—, —COO—, —OCOO—, —CH$_2$— or —C($R^{63}$)$_2$— ($R^{63}$ is a chain alkyl group having 1 to 6 carbon atoms).

All the above alkylsilylene groups each independently have a structure represented by the following formula (18):

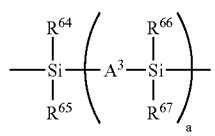

(18)

wherein $R^{64}$, $R^{65}$, $R^{66}$ and $R^{67}$ are each independently a hydrogen atom, chain alkyl group having 1 to 6 carbon atoms or aryl group having 6 to 10 carbon atoms, $A^3$ is —O—, alkylene group or arylene group, and a is an integer of 0 or 1.

All the above alkylgermylene groups each independently have a structure represented by the following formula (19):

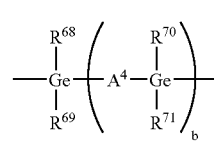

(19)

wherein $R^{68}$, $R^{69}$, $R^{70}$ and $R^{71}$ are each independently a hydrogen atom, chain alkyl group having 1 to 6 carbon atoms or aryl group having 6 to 10 carbon atoms, $A^4$ is —O—, alkylene group or arylene group, and b is an integer of 0 or 1.

All the above alkylene groups in the above formulas (18) and (19) are each independently and preferably a linear, branched or cyclic alkylene group having 1 to 10 carbon atoms such as methylene, 1,2-ethylene, 1,3-trimethylene or 1,10-decamethylene, and a hydrogen atom contained in the above groups may be substituted by a chlorine atom, bromine atom, hydroxyl group, mercapto group, alkoxyl group, thioalkyl group, alkylester group, alkylthioester group, aryl group or cyano group.

All the above alkyl groups and alkyl groups contained in the above alkoxyl groups, thioalkyl groups, alkylester groups and alkylthioester groups are each independently and preferably a linear, branched or cyclic alkyl group having 1 to 10 carbon atoms, and a hydrogen atom contained in the above groups may be substituted by a chlorine atom, bromine atom, hydroxyl group, mercapto group, alkoxyl group, thioalkyl group, alkylester group, alkylthioester group, aryl group or cyano group.

All the above aryl groups are each independently a phenyl group, naphthyl group, anthracenyl group or biphenyl group, and a hydrogen atom contained in the above groups may be substituted by a chlorine atom, bromine atom, hydroxyl group, mercapto group, alkoxyl group, thioalkyl group, alkylester group, alkylthioester group, cyano group or nitro group.

Methods of producing acid decomposable compounds having structures represented by the above formulas (1) to (6) and (10) as a recurring unit, for example, in the present invention are already known.

Methods of producing a compound having a structure represented by the above formula (1) are disclosed by Polymer Bull., 1. 199 (1978), JP-A 62-136638, EP 225,454, U.S. Pat. No. 806,597, JP-A 4-303843, JP-A 7-56354 and the like.

Methods of producing a compound having a structure represented by the above formula (2) are disclosed by Macromolecules 29, 5529 (1996), Polymer 17, 1086 (1976), JP-A 60-37549 and the like.

Methods of producing a compound having a structure represented by the above formula (3) are disclosed by Electrochem. Soc., Solid State Sci. Technol., 133(1) 181 (1986); J. Imaging Sci., 30(2)59 (1986); Macromol. Chem., Rapid Commun., 7, 121 (1986) and the like.

Methods of producing a compound having a structure represented by the above formula (4) are disclosed by U.S. Pat. No. 3,894,253, JP-A 62-190211, JP-A 2-146544, Macromol. Chem., 23, 16 (1957); JP-A 63-97945, Polymer Sci., A-1, 8, 2375 (1970); U.S. Pat. No. 4,247,611, EP 41,657, JP-A 57-31674, JP-A 64-3647, JP-A 56-17345 and the like.

Methods of producing a compound having a structure represented by the above formula (5) are disclosed by Prepr. Eur. Disc Meet. Polymer Sci., Strasbourg, p.106 (1978), Macromol. Chem., 179, 1689 (1978) and the like.

Methods of producing a compound having a structure represented by the above formula (6) are disclosed by U.S. Pat. No. 3,894,253, U.S. Pat. No. 3,940,507, JP-A 62-190211 and the like.

Methods of producing a compound having a structure represented by the above formula (10) are disclosed by J. Am. Chem. Soc., 54, 1579 (1932); J. Polym. Sci., 29, 343 (1958); J. Polym. Sci., Part A, Polym. Chem., 25, 3373 (1958); Macromolecules, 25, 12, (1992); Macromolecules, 20, 705, (1987); Macromolecules, 21, 1925, (1988); Macromol. Chem., Rapid Commun., 11, 83 (1990) and the like.

Methods of producing base decomposable compounds having structures represented by the above formulas (11) to (14) as a recurring unit are also known.

Methods of producing a compound having a structure represented by the above formula (11) are disclosed by Macromol. Chem., Rapid Commun., 5, 151 (1984); Macromol. Chem., 189, 2229 (1988); Macromol. Chem., 187, 2525 (1986); Polym. J., 22, 803 (1990) and the like.

Methods of producing a compound having a structure represented by the above formula (12) are disclosed by J. Polym. Sci., 47, 1523 (1993); J. Appl. Polym. Sci., 35, 85 (1988); J. Polym. Sci., Polym. Chem. Ed., 22, 1579 (1984); J. Polym. Sci., Polym. Chem. Ed., 14, 655 (1976); J. Polym. Sci., Polym. Chem. Ed., 17, 2429 (1979) and the like.

Methods of producing a compound having a structure represented by the above formula (13) are disclosed by J. Macromol. Sci. -Chem., A9, 1265 (1975) and the like.

Methods of producing a compound having a structure represented by the above formula (14) are disclosed by Polym. Bull., 14, 85 (1985); Macromol. Chem., 189, 1323 (1988) and the like.

The number of recurring units of the decomposable compound (A) is preferably 1 to 5,000.

(B) Nondecomposable Compound

The nondecomposable compound (B) used in the present invention is a material stable to an acid or base. The dielectric constant of the component (B) can be set or adjusted to a preferred value according to application purpose.

The nondecomposable compound (B) is, for example, an acrylic resin, urethane-based resin, polyester-based resin, polycarbonate-based resin, norbornene-based resin, styrene-based resin, polyether sulfone-based resin, silicon resin, polyamide resin, polyimide resin, polysiloxane-based resin, fluorine-based resin, polybutadiene-based resin, vinylether-based resin, vinylester-based resin, polyaryl ether-based polymer, polyarylene-based polymer, polyamide-based polymer, polyimide-based polymer, polyethylene, polyproylene, polycarbonate-based polymer, polyarylate-based polymer, polyamide-based polymer, polyamide imide-based polymer, polysulfone-based polymer, polyether sulfone-based polymer, polyether ketone-based polymer, polyphenylene sulfide-based polymer, polyether imide-based polymer, polyamide imide-based polymer, polyester imide-based polymer, modified polyphenylene oxide-based polymer, polybenzooxazole-based polymer, polyacrylic acid-based polymer, maleimide-based polymer, quinoline-based resin, benzocyclobutene-based resin, Parylene-based resin, epoxy resin, acrylic resin, novolak resin, styrene resin, phenolic resin, urea resin, isocyanate-based resin, bismaleimide resin, cyanate resin, hydrocarbon-based resin, nanofoams, organic SOG, thermosetting PPE resin and what are obtained by substituting some or all of the hydrogen atoms thereof by a fluorine atom, such as silicon fluoride-based polymer, cycloperfluorocarbon polymer, fluorocarbon, perfluorovinyl ether, Teflon (registered) or fullerene fluoride.

Specific examples of the nondecomposable compound (B) include the following polymers: polyvinylidene fluoride, polydimethylsiloxane, polytrifluoroethyl methacrylate, polyoxypropylene, polyvinylisobutyl ether, polyvinylethyl ether, polyoxyethylene, polyvinylbutyl ether, polyvinylpentyl ether, polyvinylhexyl ether, poly(4-methyl-1-pentene), cellulose acetate butyrate, poly(4-fluoro-2-trifluoromethylstyrene), polyvinyloctyl ether, poly(vinyl 2-ethylhexyl ether), polyvinyldecyl ether, poly(2-methoxyethyl acrylate), polybutyl acrylate, poly(t-butyl methacrylate), polyvinyldodecyl ether, poly(3-ethoxypropyl acrylate), polyoxycarbonyl tetramethylene, polyvinyl propionate, polyvinyl acetate, polyvinylmethyl ether, polyethyl acrylate, ethylene-vinyl acetate copolymer, (80% to 20% of vinylacetate) cellulose propionate, cellulose acetate propionate, benzyl cellulose, phenol-formaldehyde resin, cellulose triacetate, polyvinylmethyl ether (isotactic), poly(3-methoxypropyl acrylate), poly(2-ethoxyethyl acrylate), polymethyl acrylate, polyisopropyl methacrylate, poly(1-decene), polypropylene (atactic, density of 0.8575 g/cm$^3$), poly(vinyl sec-butyl ether) (isotactic), polydodecyl methacrylate, polyoxyethylene oxysuccinoyl, (polyethylene succinate) polytetradecyl methacrylate, ethylene-propylene copolymer (EPR-rubber), polyhexadecyl methacrylate, polyvinyl formate, poly(2-fluoroethyl methacrylate), polyisobutyl methacrylate, ethyl cellulose, polyvinyl acetal, cellulose acetate, cellulose tripropionate, polyoxymethylene, polyvinyl butyral, poly(n-hexyl methacrylate), poly(n-butyl methacrylate), polyethylidene dimethacrylate, poly(2-ethoxyethyl methacrylate), polyoxyethylene oxymaleoyl, (polyethylene maleate) poly (n-propyl methacrylate), poly(3,3,5-trimethylcyclohexyl methacrylate), polyethyl methacrylate, poly(2-nitro-2-methylpropyl methacrylate), polytriethylcarbinyl methacrylate, poly(1,1-diethylpropyl methacrylate), polymethyl methacrylate, poly(2-decyl-1,3-butadiene), polyvinyl alcohol, polyethyl glycolate methacrylate, poly(3-methylcyclohexyl methacrylate), poly(cyclohexyl α-ethoxyacrylate), methyl cellulose (low viscosity), poly(4-methylcyclohexyl methacrylate), polydecamethylene glycol dimethacrylate, polyurethane, poly(1,2-butadiene), polyvinyl formal, poly(2-bromo-4-trifluoromethylstyrene), cellulose nitrate, poly(sec-butyl α-chloroacrylate), poly(2-heptyl-1,3-butadiene), poly (ethyl α-chloroacrylate), poly(2-isopropyl-1,3-butadiene), poly(2-methylcyclohexyl methacrylate), polypropylene (density of 0.9075 g/cm$^3$), polyisobutene, polybornyl methacrylate, poly(2-t-butyl-1,3-butadiene), polyethylene glycol dimethacrylate, polycyclohexyl methacrylate, poly(cyclohexanediol-1,4-dimethacrylate), butyl rubber (unvulcanized), polytetrahydrofurfuryl methacrylate), guttapercha (β), polyethylene ionomer, polyoxyethylene (high molecular weight), polyethylene (density of 0.914 g/cm$^3$), (density of 0.94 to 0.945 g/cm$^3$), (density of 0.965 g/cm$^3$), poly(1-methylcyclohexyl methacrylate), poly(2-hydroxyethyl methacrylate), polyvinyl chloroacetate, polybutene (isotactic), polyvinyl methacrylate, poly(N-butyl-methacrylamide), guttapercha (α), terpene resin, poly(1,3-butadiene), shellac, poly(methyl α-chloroacrylate), poly(2-chloroethyl methacrylate), poly(2-diethylaminoethyl methacrylate), poly(2-chlorocyclohexyl methacrylate), poly(1,3-butadiene) (35% of cis-form; 56% of trans-form 1.5180; 7% of 1,2-addition), natural rubber, polyallyl methacrylate, polyvinyl chloride+40% of dioctyl phthalate, polyacrylonitrile, polymethacrylonitrile, poly(1,3-butadiene) (rich with cis type), butadiene-acrylonitrile copolymer, polymethyl isopropenyl ketone, polyisoprene, polyester resin rigid (about 50% of styrene), poly(N-(2-methoxyethyl)methacrylamide), poly(2,3-dimethylbutadiene) (methyl rubber), vinyl chloride-vinyl acetate copolymer (95/5 to 90/10), polyacrylic acid, poly(1,3-dichloropropyl methacrylate), poly(2-chloro-1-(chloromethyl)ethyl methacrylate), polyacrolein, poly(1-vinyl-2-pyrrolidone), hydrochlorinated rubber, nylon 6; nylon 6,6; nylon 6,10 (molded product), butadiene-styrene copolymer (about 30% of styrene), poly(cyclohexyl-α-chloroacrylate) block copolymer, poly(2-chloroethyl-α-chloroacrylate), butadiene-styrene copolymer (about 75/25), poly(2-aminoethyl methacrylate), polyfurfuryl methacrylate, polybutylmercaptyl methacrylate, poly(1-phenyl-n-amyl methacrylate), poly(N-methyl-methacrylamide), cellulose, polyvinyl chloride, urea formaldehyde resin, poly(sec-butyl α-bromoacrylate), poly(cyclohexyl α-bromoacrylate), poly(2-bromoethyl methacrylate), polydihydroabietic acid, polyabietic acid, polyethylmercaptyl methacrylate, poly(N-allylmethacrylamide), poly(1-phenylethyl methacrylate), polyvinylfuran, poly(2-vinyltetrahydrofuran), poly(vinylchloride)+40% of tricresyl phosphate, poly(p-methoxybenzyl methacrylate), polyisopropyl methacrylate, poly(p-isopropylstyrene), polychloroprene, poly(oxyethylene-α-benzoate-ω-methacrylate), poly(p,p'-xylylenyl dimethacrylate), poly(1-phenylallyl methacrylate), poly(p-cyclohexylphenyl methacrylate), poly(2-phenylethyl methacrylate), poly(oxycarbonyloxy-1,4-phenylene-1-propyl), poly(1-(o-chlorophenyl)ethylmethacrylate), styrene-maleic anhydride copolymer, poly(1-phenylcyclohexyl methacrylate), poly(oxycarbonyloxy-1,4-phenylene-1,3-dimethylbutylidene-1,4-phenylene), poly(methyl α-bromoacrylate), polybenzyl methacrylate, poly(2-(phenylsulfonyl)ethyl methacrylate), poly(m-cresyl methacrylate), styrene-acrylonitrile copolymer (about 75/25), poly(oxycarbonyloxy-1,4-phenylene isobutylidene-1,4-phenylene), poly(o-methoxyphenyl methacrylate), polyphenyl methacrylate, poly(o-cresyl methacrylate), polydiallyl phthalate, poly(2,3-dibromopropyl methacrylate), poly(oxycarbonyloxy-1,4-phenylene-1-methyl-butylidene-1,4-phenylene), poly(oxy-2,6-dimethylphenylene), polyoxyethylene oxyterephthaloyl (amorphous), polyethylene terephthalate, polyvinyl benzoate, poly(oxycarbonyloxy-1,4-phenylenebutylidene-1,4-phenylene), poly(1,2-diphenylethyl methacrylate), poly(o-chlorobenzyl methacrylate), poly(oxycarbonyloxy-1,4-phenylene-sec-butylidene-1,4-phenylene), polyoxypentaerythritoloxyphthaloyl, poly(m-nitrobenzyl methacrylate), poly(oxycarbonyloxy-1,4-phenyleneisopropylidene-1,4-phenylene), poly(N-(2-phenylethyl)methacrylamide), poly(4-methoxy-2-methylstyrene), poly(o-methylstyrene), polystyrene, poly(oxycarbonyloxy-1,4-phenylenecyclohexylidene-1,4-phenylene), poly(o-methoxystyrene), polydiphenylmethyl methacrylate, poly(oxycarbonyloxy-1,4-phenyleneethylidene-1,4-phenylene), poly(p-bromophenyl methacrylate), poly(N-benzylmethacrylamide), poly(p-methoxystyrene), polyvinylidene chloride, polysulfide ("Thiokol"), poly(o-chlorodiphenylmethyl methacrylate), poly(oxycarbonyloxy-1,4-(2,6-dichloro)phenyleneisopropylidene-1,4-(2,6-dichloro)phenylene), poly(oxycarbonyloxybis(1,4-(3,5-dichlorophenylene)))poly pentachlorophenyl methacrylate, poly(o-chlorostyrene), poly(phenyl α-bromoacrylate), poly(p-divinylbenzene), poly(N-vinylphthalimide), poly(2,6-dichlorostyrene), poly(β-naphthyl methacrylate), poly(α-naphthylcarbinyl methacrylate), polysulfone, poly(2-vinylthiophene), poly(α-naphthyl methacrylate), poly(oxycarbonyloxy-1,4-phenylenediphenyl-methylene-1,4-phenylene), polyvinylphenyl sulfide, butylphenol formaldehyde resin, urea-thiourea-formaldehyde resin, polyvinyl naphthalene, polyvinyl carbazole, naphthalene-formaldehyde resin, phenol-formaldehyde resin and polypentabromophenyl methacrylate.

As the component (B) used in the present invention may be used a hydrolyzate of at least one compound selected from the group consisting of a metal alkoxide represented by the following formula (20) and a metal halide represented by the following formula (21):

$$M^O(OR)_t Y_u \quad (20)$$

$$M^O X_t Y_u \quad (21)$$

(In the formulas (20) and (21), $M^O$ is a positive divalent to pentavalent atom, R is an alkyl group or aryl group, Y is a hydrogen atom, alkyl group, aryl group, hydroxyl group, alkoxyl group or aryloxy group, X is a halogen atom, and t and u are each independently an integer of 0 or more, with the proviso that (t+u) is equal to the valence of $M^O$.)

It should be understood that the above hydrolyzate includes what is obtained by hydrolyzing all the hydrolyzable portions contained in a raw material and also what is obtained by hydrolyzing some and not all of the hydrolyzable portions.

The positive divalent to pentavalent atom $M^O$ in the above formulas (20) and (21) is, for example, B, Si, P or metal atom. The metal atom is preferably a group 2A or 3B metal atom of the periodic table or a transition metal atom.

All the above alkyl groups and alkyl groups contained in the above alkoxyl groups may be a linear, branched or cyclic alkyl group having 1 to 10 carbon atoms, and some of the hydrogen atoms contained in the above groups may be substituted by a fluorine atom, or some or all of the hydrogen atoms contained in the above groups may be substituted by a chlorine atom, bromine atom, perfluoroalkyl group, hydroxyl group, mercapto group, thioalkyl group, alkoxyl group, perfluoroalkoxyl group, alkylester group, alkylthioester group, perfluoroalkylester group, cyano group, nitro group or aryl group.

All the above aryl groups and aryl groups contained in the above aryloxy groups are each independently a phenyl group, naphthyl group, anthracenyl group, biphenyl group or what is obtained by substituting a hydrogen atom contained in the above groups by a chlorine atom, bromine atom, hydroxyl group, mercapto group, alkoxyl group, thioalkyl group, alkylester group, alkylthioester group, cyano group or nitro group.

The halogen atom is preferably fluorine, chlorine or bromine.

Examples of the silicon compound represented by the above formula (20) include tetraalkoxysilanes such as tetramethoxysilane, tetraethoxysilane (generally called TEOS), tetra-n-propyloxysilane, tetraisopropyloxysilane and tetra-n-butoxysilane; monoalkyltrialkoxysilanes such as methyltrimethoxysilane, methyltriethoxysilane, methyltri-n-propyloxysilane, ethyltriethoxysilane and cyclohexyltriethoxysilane; monoaryltrialkoxysilanes such as phenyltriethoxysilane, naphthyltriethoxysilane, 4-chlorophenyltriethoxysilane, 4-cyanophenyltriethoxysilane, 4-aminophenyltriethoxysilane, 4-nitrophenyltriethoxysilane, 4-methylphenyltriethoxysilane and 4-hydroxyphenyltriethoxysilane; monoaryloxytrialkoxysilanes such as phenoxytriethoxysilane, naphthyloxytriethoxysilane, 4-chlorophenyloxytriethoxysilane, 4-cyanophenyltrioxyethoxysilane, 4-aminophenyloxytriethoxysilane, 4-nitrophenyloxytriethoxysilane, 4-methylphenyloxytriethoxysilane and 4-hydroxyphenyloxytriethoxysilane; monohydroxytrialkoxysilanes such as monohydroxytrimethoxysilane, monohydroxytriethoxysilane and monohydroxytri-n-propyloxysilane; dialkyldialkoxysilanes such as dimethyldimethoxysilane, dimethyldiethoxysilane, dimethyldi-n-propyloxysilane, methyl(ethyl)diethoxysilane and methyl(cyclohexyl)diethoxysilane;

monoalkylmonoaryldialkoxysilanes such as methyl(phenyl)diethoxysilane; diaryldialkoxysilanes such as diphenyldiethoxysilane; diaryloxydialkoxysilanes such as diphenoxydiethoxysilane; monoalkylmonoaryloxydialkoxysilanes such as methyl(phenoxy)diethoxysilane; monoarylmonoaryloxydialkoxysilanes such as phenyl(phenoxy)diethoxysilane; dihydroxydialkoxysilanes such as dihydroxydimethoxysilane, dihydroxydiethoxysilane and dihydroxydi-n-propyloxysilane: monoalkylmonohydroxydialkoxysilanes such as methyl(hydroxy)dimethoxysilane; monoarylmonohydroxydialkoxysilanes such as phenyl(hydroxy)dimethoxysilane; trialkylmonoalkoxysilanes such as trimethylmethoxysilane, trimethylethoxysilane, trimethyl-n-propyloxysilane, dimethyl(ethyl)ethoxysilane and dimethyl(cyclohexyl)ethoxysilane;

dialkylmonoarylmonoalkoxysilanes such as dimethyl(phenyl)ethoxysilane; monoalkyldiarylmonoalkoxysilanes such as methyl(diphenyl)ethoxysilane; triaryloxymonoalkoxysilanes such as triphenoxyethoxysilane; monoalkyldiaryloxymonoalkoxysilanes such as methyl(diphenoxy)ethoxysilane; monoaryldiaryloxymonoalkoxysilanes such as phenyl(diphenoxy)ethoxysilane; dialkylmonoaryloxymonoalkoxysilanes such as dimethyl(phenoxy)ethoxysilane; diarylmonoaryloxymonoalkoxysilanes such as diphenyl(phenoxy)ethoxysilane;

monoalkylmonoarylmonoaryloxymonoalkoxysilanes such as methyl(phenyl)(phenoxy)ethoxysilane; trihydroxymonoalkoxysilanes such as trihydroxymethoxysilane, trihydroxyethoxysilane and trihydroxy-n-propyloxysilane; and oligomers of the above compounds such as dimers to pentamers of tetramethoxysilane.

Examples of the silicon compound represented by the above formula (21) include tetrahalogenosilanes such as tetrachlorosilane, tetrabromosilane, tetraiodosilane, trichlorobromosilane and dichlorodibromosilane; monoalkyltrihalogenosilanes such as methyltrichlorosilane, methyldichlorobromosilane and cyclohexyltrichlorosilane; monoaryltrihalogenosilanes such as phenyltrichlorosilane, naphthyltrichlorosilane, 4-chlorophenyltrichlorosilane and phenyldichlorobromosilane; monoaryloxytrihalogenosilanes such as phenoxytrichlorosilane and phenoxydichlorobromosilane; monoalkoxytrihalogenosilanes such as methoxytrichlorosilane and ethoxytrichlorosilane; dialkyldihalogenosilanes such as dimethyldichlorosilane, methyl(ethyl)dichlorosilane and methyl(cyclohexyl)dichlorosilane; monoalkylmonoaryldihalogenosilanes such as methyl(phenyl)dichlorosilane; diaryldihalogenosilanes such as diphenyldichlorosilane; diaryloxydihalogenosilanes such as diphenoxydichlorosilane; monoalkylmonoaryloxydihalogenosilanes such as methyl(phenoxy)dichlorosilane; monoarylmonoaryloxydihalogenosilanes such as phenyl(phenoxy)dichlorosilane; dialkoxydihalogenosilanes such as diethoxydichlorosilane; monoalkylmonoalkoxydichlorosilanes such as methyl(ethoxy)dichlorosilane; monoarylmonoethoxydichlorosilanes such as phenyl(ethoxy)dichlorosilane; trialkylmonohalogenosilanes such as trimethylchlorosilane, dimethyl(ethyl)chlorosilane and dimethyl(cyclohexyl)chlorosilane; dialkylmonoarylmonohalogenosilanes such as dimethyl(phenyl)chlorosilane; monoalkyldiarylmonohalogenosilanes such as methyl(diphenyl)chlorosilane; triaryloxymonohalogenosilanes such as triphenoxychlorosilane; monoalkyldiaryloxymonohalogenosilanes such as methyl(diphenoxy)chlorosilane; monoaryldiaryloxymonohalogenosilanes such as phenyl(diphenoxy)chlorosilane; dialkylmonoaryloxymonohalogenosilanes such as dimethyl(phenoxy)chlorosilane; diarylmonoaryloxymonohalogenosilanes such as diphenyl(phenoxy)chlorosilane;

monoalkylmonoarylmonoaryloxymonohalogenosilanes such as methyl(phenyl)(phenoxy)chlorosilane; triethoxymonohalogenosilanes such as triethoxychlorosilane; and oligomers of the above compounds such as dimers to pentamers of tetrachlorosilane.

Other examples of the compounds represented by the above formula (20) and (21) include alkoxides and halides such as diethoxyberyllium, dichloroberyllium, triethoxyboron, trichloroboron, diethoxymagnesium, dichloromagnesium, triethoxyaluminum, trichloroaluminum, triethoxyphosphorus, trichlorophosphorus, pentaethoxyphosphorus, pentachlorophosphorus, diethoxycalcium, dichlorocalcium, triethoxyscandium, trichloroscandium, tetraethoxytitanium, tetrabutoxytitanium, tetrachlorotitanium, diethoxymanganese, dichloromanganese, diethoxyiron, dichloroiron, triethoxyiron, trichloroiron, diethoxycobalt, dichlorocobalt, diethoxynickel, dichloronickel, diethoxyzinc, dichlorozinc, triethoxygallium, trichlorogallium tetramethoxygermanium, tetraethoxygermanium, tetrachlorogermanium, diethoxystrontium, dichlorostrontium, triethoxyyttrium, trichloroyttrium, tetramethoxyzirconium, tetraethoxyzirconium, tetrachlorozirconium, diethoxycadmium, dichlorocadmium, triethoxyindium, trichloroindium, tetraethoxytellurium, tetrachlorotellurium, diethoxybarium, dichlorobarium, triethoxylanthanum, trichlorolanthanum, triethoxyneodymium, trichloroneodymium, triethoxyytterbium, trichloroytterbium, hexaethoxytungsten, hexachlorotungsten, pentaethoxytantalum, pentachlorotantalum, diethoxylead, dichlorolead, triethoxybismuth, trichlorobismuth, tetraethoxythorium and tetrachlorothorium.

Out of these, tetraalkoxysilanes such as tetramethoxysilane and tetraethoxysilane; trialkoxyaluminums such as triethoxyaluminum; tetraalkoxytitaniums such as tetraethoxytitaniun; tetrahalogenosilanes such as tetrachlorosilane; trihalogenoaluminums such as trichloroaluminum; and tetrahalogenotitaniums such as tetrachlorotitanium are preferred. More preferred are tetraalkoxysilanes such as tetramethoxysilane and tetraethoxysilane; trialkoxyaluminums such as triethoxyaluminum; and tetrahalogenosilanes such as tetrachlorosilane, and the most preferred are tetraalkoxysilanes such as tetraethoxysilane. Any number of compounds out of the above compounds may be used in combination in any ratio.

The component (B) used in the present invention can be produced by subjecting the above compound to a hydrolytic reaction. The hydrolytic reaction is preferably carried out in a suitable solvent. Examples of the solvent include water-soluble solvents such as methanol, ethanol, n-propanol, isopropyl alcohol, n-butanol, isobutyl alcohol, t-butyl alcohol, acetone, tetrahydrofuran, dioxane and acetonitrile and aqueous solutions thereof.

Since these water-soluble solvents are removed in the subsequent step, methanol, ethanol, n-propanol, isopropyl alcohol, acetone and tetrahydrofuran having a relatively low boiling point are preferred, and alcohols such as methanol, ethanol, n-propanol and isopropyl alcohol are more preferred from the view point of solubility for the raw material.

The most preferred is ethanol.

The hydrolytic reaction for synthesizing the component (B) is carried out in the presence of water and a suitable catalyst as described below.

Stated more specifically, the compound represented by the above formula (20) or (21) is dissolved in a suitable organic solvent and water is added to this solution intermittently or continuously. The catalyst may be dissolved or dispersed in the organic solvent in advance or dissolved or dispersed in water to be added.

The temperature for carrying out the hydrolytic reaction is generally 0 to 100° C., preferably 15 to 80° C.

Water for carrying out the hydrolytic reaction is not particularly limited but preferably ion exchange water.

The amount of water is 0.25 to 3 mols, particularly preferably 0.3 to 2.5 mols based on 1 mol of the total of an alkoxyl group and halogen atom contained in the compound represented by the above formula (20) or (21).

The catalyst for carrying out hydrolysis is a metal chelate compound, organic acid, inorganic acid, organic base or inorganic base.

Examples of the metal chelate compound used as the catalyst include titanium chelate compounds such as triethoxy.mono(acetylacetonato)titanium, tri-n-propoxy.mono(acetylacetonato)titanium, tri-i-propoxy.mono(acetylacetonato)titanium, tri-n-butoxy.mono(acetylacetonato)titanium, tri-sec-butoxy.mono(acetylacetonato)titanium, tri-t-butoxy.mono(acetylacetonato)titanium, diethoxy.bis(acetylacetonato)titanium, di-n-propoxy.bis(acetylacetonato)titanium, di-i-propoxy.bis(acetylacetonato)titanium, di-n-butoxy.bis(acetylacetonato)titanium, di-sec-butoxy.bis(acetylacetonato)titanium, di-t-butoxy.bis(acetylacetonato)titanium, monoethoxy.tris(acetylacetonato)titanium, mono-n-propoxy.tris(acetylacetonato)titanium, mono-i-propoxy.tris(acetylacetonato)titanium, mono-n-butoxy.tris(acetylacetonato)titanium, mono-sec-butoxy.tris(acetylacetonato)titanium, mono-t-butoxy.tris(acetylacetonato)titanium, tetrakis(acetylacetonato)titanium, triethoxy.mono(ethylacetoacetate)titanium, tri-n-propoxy.mono(ethylacetoacetate)titanium, tri-i-propoxy.mono(ethylacetoacetate)titanium, tri-n-butoxy.mono(ethylacetoacetate)titanium, tri-sec-butoxy.mono(ethylacetoacetate)titanium, tri-t-butoxy.mono(ethylacetoacetate)titanium, diethoxy.bis(ethylacetoacetate)titanium, di-n-propoxy.bis(ethylacetoacetate)titanium, di-i-propoxy.bis(ethylacetoacetate)titanium, di-n-butoxy.bis(ethylacetoacetate)titanium, di-sec-butoxy.bis(ethylacetoacetate)titanium, di-t-butoxy.bis(ethylacetoacetate)titanium, monoethoxy.tris(ethylacetoacetate)titanium, mono-n-propoxy.tris(ethylacetoacetate)titanium, mono-i-propoxy.tris(ethylacetoacetate)titanium, mono-n-butoxy.tris(ethylacetoacetate)titanium, mono-sec-butoxy.tris(ethylacetoacetate)titanium, mono-t-butoxy.tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium and tris(acetylacetonato)mono(ethylacetoacetate)titanium; zirconium chelate compounds such as triethoxy.mono(acetylacetonato)zirconium, tri-n-propoxy.mono(acetylacetonato)zirconium, tri-i-propoxy.mono(acetylacetonato)zirconium, tri-n-butoxy.mono(acetylacetonato)zirconium, tri-sec-butoxy.mono(acetylacetonato)zirconium, tri-t-butoxy.mono(acetylacetonato)zirconium, diethoxy.bis(acetylacetonato)zirconium, di-n-propoxy.bis(acetylacetonato)zirconium, di-i-propoxy.bis(acetylacetonato)zirconium, di-n-butoxy.bis(acetylacetonato)zirconium, di-sec-butoxy.bis(acetylacetonato)zirconium, di-t-butoxy.bis(acetylacetonato)zirconium, monoethoxy.tris(acetylacetonato)zirconium, mono-n-propoxy.tris(acetylacetonato)zirconium, mono-i-propoxy.tris(acetylacetonato)zirconium, mono-n-butoxy.tris(acetylacetonato)zirconium, mono-sec-butoxy.tris(acetylacetonato)zirconium, mono-t-butoxy.tris(acetylacetonato)zirconium, tetrakis(acetylacetonato)zirconium, triethoxy.mono(ethylacetoacetate)zirconium, tri-n-propoxy.mono(ethylacetoacetate)zirconium, tri-i-propoxy.mono(ethylacetoacetate)zirconium, tri-n-butoxy.mono(ethylacetoacetate)zirconium, tri-sec-butoxy.mono(ethylacetoacetate)zirconium, tri-t-butoxy.mono(ethyiacetoacetate)zirconium, diethoxy.bis(ethylacetoacetate)zirconium, di-n-propoxy.bis(ethylacetoacetate)zirconium, di-i-propoxy.bis(ethylacetoacetate)zirconium, di-n-butoxy.bis(ethylacetoacetate)zirconium, di-sec-butoxy.bis(ethylacetoacetate)zirconium, di-t-butoxy.bis(ethylacetoacetate)zirconium, monoethoxy.tris(ethylacetoacetate)zirconium, mono-n-propoxy.tris(ethylacetoacetate)zirconium, mono-i-propoxy.tris(ethylacetoacetate)zirconium, mono-n-butoxy.tris(ethylacetoacetate)zirconium, mono-sec-butoxy.tris(ethylacetoacetate)zirconium, mono-t-butoxy.tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium and tris(acetylacetonato)mono(ethylacetoacetate)zirconium; and aluminum chelate compounds such as tris(acetylacetonato)aluminum and tris(ethylacetoacetate)aluminum.

Examples of the organic acid used as the catalyst include acetic acid, propionic acid, butanoic acid, pentanoic acid, hexoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid.

Examples of the inorganic acid used as the catalyst include hydrochloric acid, nitric acid, sulfuric acid, hydrofluoric acid and phosphoric acid.

Examples of the organic base used as the catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene and tetramethylammonium hydroxide.

Examples of the inorganic base used as the catalyst include ammonia, sodium hydroxide, potassium hydroxide, barium hydroxide and calcium hydroxide.

Out of these, a metal chelate compound, an organic acid or an inorganic acid is preferably used as the catalyst and a titanium chelate compound or an organic acid is more preferably used.

These compounds may be used alone or in combination of two or more as the catalyst.

The amount of the catalyst is preferably 0.001 to 10 parts by weight, more preferably 0.01 to 10 parts by weight based on 100 parts by weight of the compound represented by the above formula (20) or (21) in terms of $SiO_2$.

Further, it is preferred to remove the residual water and an alcohol formed as a reaction by-product after the hydrolysis of the compound represented by the above formula (20) or (21).

A ladder type polysilsesquioxane represented by the following formula (22) may be suitably used as the nondecomposable compound (B):

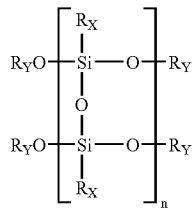

(22)

wherein $R_X$ is a monovalent organic group, $R_Y$ is a hydrogen atom or monovalent organic group, $R_X$ and $R_Y$ may be the same or different, and n is a positive integer corresponding to the molecular weight.

Examples of the monovalent organic group in the above formula (22) include alkyl group, aryl group, allyl group and glycidyl group. Examples of the alkyl group include methyl group, ethyl group and propyl group, preferably those having 1 to 5 carbon atoms. These alkyl groups may be chain or branched. Examples of the aryl group include phenyl group, naphthyl group and tolyl group. A hydrogen atom contained in the alkyl group, aryl group, allyl group and glycidyl group may be substituted by a halogen atom such as chlorine atom or bromine atom, hydroxyl group, mercapto group, alkoxyl group, thioalkyl group, alkylester group, alkylthioester group or aryl group.

Methods of producing the compound having a structure represented by the above formula (22) are disclosed by JP-A 56-157885, JP-A 57-40526, JP-A 58-69217 and the like. Commercially available products of the compound include GR-100, GR-650, GR-908 and GR-950 (of Showa Denko K.K.).

Not only the compound represented by the above formula (22) but also a hydrolyzate and condensate thereof may be used as the component (B). The hydrolytic reaction and condensation reaction can be carried out under conditions (i.e., catalyst, water and reaction temperature) similar to the conditions of the hydrolytic reaction of the compounds represented by the above formulas (20) and (21). The compound represented by the above formula (22) has a weight average molecular weight in terms of polystyrene of preferably 500 to 500,000, more preferably 500 to 300,000.

In the present invention, an inorganic oxide particle may be used together with the above resin. The inorganic oxide particle is stable to an acid or base generated from the radiation sensitive decomposer (C) which will be described hereinafter. An oxide particle having a preferred dielectric constant may be selected according to application purpose and used.

The oxide particle is preferably an oxide containing an atom such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Bi or Te, more preferably an oxide such as BeO, MgO, CaO, SrO, BaO, $Sc_2O_3$, $Y_2O_3$, $La_2O_3$, $Ce_2O_3$, $Gd_2O_3$, $Tb_2O_3$, $Dy_2O_3$, $Yb_2O_3$, $Lu_2O_3$, $TiO_2$, $ZrO_2$, $HfO_2$, $Nb_2O_5$, $MoO_3$, $WO_3$, ZnO, $B_2O_3$, $Al_2O_3$, $SiO_2$, $GeO_2$, $SnO_2$, PbO, $Bi_2O_3$ or $TeO_2$, or a composite oxide containing any one of these, such as $Al_2O_3$—MgO, $Al_2O_3$—$SiO_2$, ZnO—$Y_2O_3$, $ZrO_2$—$Ce_2O_3$, $ZrO_2$—$TiO_2$—$SnO_2$, $TeO_2$—BaO—ZnO, $TeO_2$—$WO_3$—$Ta_2O_5$, $TeO_2$—$WO_3$—$Bi_2O_3$, $TeO_2$—BaO—PbO, CaO—$Al_2O_3$, CaO—$Al_2O_3$—BaO, CaO—$Al_2O_3$—$Na_2O$, CaO—$Al_2O_3$—$K_2O$, CaO—$Al_2O_3$—$SiO_2$, PbO—$Bi_2O_3$—BaO, PbO—$Bi_2O_3$—ZnO, PbO—$Bi_2O_3$, PbO—$Bi_2O_3$—BaO—ZnO, PbO—$Bi_2O_3$—CdO—$Al_2O_3$, PbO—$Bi_2O_3$—$GeO_2$, PbO—$Bi_2O_3$—$GeO_2$—$Ti_2O$, BaO—PbO—$Bi_2O_3$, BaO—PbO—$Bi_2O_3$—ZnO, $Bi_2O_3$—$Ga_2O_3$—PbO, $Bi_2O_3$—$Ga_2O_3$—CdO or $Bi_2O_3$—$Ga_2O_3$—(Pb,Cd)O.

The particle diameter of the oxide particle is preferably smaller than the thickness of a film of the dielectric constant changing composition of the present invention. It can be, for example, 2 μm or less, preferably 0.2 μm or less, particularly preferably 0.1 μm or less. When the particle diameter is larger than 2 μm, the obtained film of the dielectric constant changing composition may have a problem with its surface condition.

The surface of the above oxide particle may be modified by contacting a silane coupling agent, surfactant or coordinating compound having coordinating ability to a metal atom constituting the oxide before use.

The inorganic oxide particle is used in an amount of preferably 500 parts or less by weight, more preferably 300 parts or less by weight based on 100 parts by weight of the hydrolyzate.

The weight average molecular weight of the nondecomposable compound (B) is preferably 200 to 1,000,000, more preferably 200 to 500,000.

The amount of the component (B) is preferably 5 to 90 parts by weight, more preferably 10 to 70 parts by weight based on 100 parts by weight of the total of the component (B) and the component (A). When the amount of the component (B) is smaller than 5 parts by weight, the dielectric constant changing material becomes brittle and when the amount of the component (B) is larger than 90 parts by weight, the obtained dielectric constant difference is apt to be small.

It is a matter of course that the component (B) and the component (A) can be produced separately. The component (A) may be produced in the presence of the component (B) prepared in advance, the component (B) may be produced in the presence of the component (A) prepared in advance, or the components (A) and (B) may be produced in the same reaction system before use.

(C) Radiation Sensitive Decomposer

The radiation sensitive decomposer (C) used in the present invention can be a radiation sensitive acid generator or a radiation sensitive base generator. Preferably, when an acid decomposable compound is used as the decomposable compound (A), a radiation sensitive acid generator is used as the radiation sensitive decomposer (C) and when a base decomposable compound is used as the decomposable compound (A), a radiation sensitive base generator is used as the radiation sensitive decomposer (C).

The above radiation sensitive acid generator is selected from a trichloromethyl-s-triazine, diaryl iodonium salt, triaryl sulfonium salt, quaternary ammonium salt and sulfonic acid ester.

Examples of the trichloromethyl-s-triazine include tris(2, 4,6-trichloromethyl)-s-triazine, 2-phenyl-bis(4,6-trichloromethyl)-s-triazine, 2-(4-chlorophenyl)-bis(4,6-trichloromethyl)-s-triazine, 2-(3-chlorophenyl)-bis(4,6-trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis(4,6- trichloromethyl)-s-triazine, 2-(2-methoxyphenyl)-bis(4,6-trichloromethyl)-s-triazine, 2-(4-methylthiophenyl)-bis(4,6-trichloromethyl)-s-triazine, 2-(3-methylthiophenyl)-bis(4,6-trichloromethyl)-s-triazine, 2-(2-methylthiophenyl)-bis(4,6-trichloromethyl)-s-triazine, 2-(4-methoxynaphthyl)-bis(4,6-trichloromethyl)-s-triazine, 2-(3-methoxynaphthyl)-bis(4,6-trichloromethyl)-s-triazine, 2-(2-methoxynaphthyl)-bis(4,6-trichloromethyl)-s-triazine, 2-(4-methoxy-β-styryl)-bis(4,6-trichloromethyl)-s-triazine, 2-(3-methoxy-β-styryl)-bis(4,6-trichloromethyl)-s-triazine, 2-(2-methoxy-β-styryl)-bis(4,6-trichloromethyl)-s-triazine, 2-(3,4,5-trimethoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, 2-(3-methylthio-β-styryl)-bis(4,6-trichloromethyl)-s-triazine, 2-piperonyl-bis(4,6-trichloromethyl)-s-triazine, 2-[2-(furan-2-yl)ethenyl]-bis(4,6-trichloromethyl)-s-triazine, 2-[2-(5-methylfuran-2-yl)ethenyl]-bis(4,6-trichloromethyl)-s-triazine and 2-[2-(4-diethylamino-2-methylphenyl)ethenyl]-bis(4,6-trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenyliodonium-p-toluene sulfonate, diphenyliodonium butyltris(2,6-difluorophenyl)borate, diphenyliodonium hexyltris(p-chlorophenyl)borate, diphenyliodonium hexyltris(3-trifluoromethylphenyl)borate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl)borate and bis(4-tert-butylphenyl)iodonium hexyltris(3-trifluoromethylphenyl)borate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethane sulfonate, 4-phenylthiophenyldiphenylsulfonium trifluoroacetate, 4-phenylthiophenyldiphenylsulfonium-p-toluene sulfonate, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyldimethylsulfonium tetrafluoroborate, 4-hydroxy-1-naphthalenyldimethylsulfonium hexafluorophosphonate, 4-hydroxy-1-naphthalenyldimethylsulfonium hexafluoroarsenate, 4-hydroxy-1-naphthalenyldimethylsulfonium trifluoromethane sulfonate, 4-hydroxy-1-naphthalenyldimethylsulfonium trifluoroacetate, 4-hydroxy-1-naphthalenyldimethylsulfonium-p-toluene sulfonate, 4-hydroxy-1-naphthalenyldimethylsulfonium butyltris(2,6-difluorophenyl)borate, 4-hydroxy-1-naphthalenyldimethylsulfonium hexyltris(p-chlorophenyl)borate and 4-hydroxy-1-naphthalenyldimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroacetate, benzyltrimethylammonium-p-toluene sulfonate, benzyltrimethylammonium butyltris(2,6-difluorophenyl)borate, benzyltrimethylammonium hexyltris(p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl)borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethane sulfonate, N-cinnamylideneethylphenylammonium trifluoroacetate, N-cinnamylideneethylphenylammonium-p-toluene sulfonate, N-cinnamylideneethylphenylammonium butyltris(2,6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid) ester, pyrogallol-tri(trifluoromethanesulfonic acid)ester, pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester, N-hydroxynaphthalimido-p-toluenesulfonic acid ester, N-hydroxynaphthalimido-trifluoromethanesulfonic acid ester, N-hydroxynaphthalimido-methanesulfonic acid ester, N-hydroxy-5-norbornene-2,3-dicarboxyimido-p-toluenesulfonic acid ester, N-hydroxy-5-norbornene-2,3-dicarboxyimido-trifluoromethanesulfonic acid ester, N-hydroxy-5-norbornene-2,3-dicarboxyimido-methanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester.

Out of these compounds, 2-(3-chlorophenyl)-bis(4,6-trichloromethyl)-s-triazine, 2-(4-methoxyphenyl)-bis(4,6-trichloromethyl)-s-triazine, 2-(4-methylthiophenyl)-bis(4,6-trichloromethyl)-s-triazine, 2-(4-methoxy-β-styryl)-bis(4,6-trichloromethyl)-s-triazine, 2-piperonyl-bis(4,6-trichloromethyl)-s-triazine, 2-[2-(furan-2-yl)ethenyl]-bis(4,6-trichloromethyl)-s-triazine, 2-[2-(5-methylfuran-2-yl)ethenyl]-bis(4,6-trichloromethyl)-s-triazine, 2-[2-(4-diethylamino-2-methylphenyl)ethenyl]-bis(4,6-trichloromethyl)-s-triazine and 2-(4-methoxynaphthyl)-bis(4,6-trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryl iodonium salts; triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenylsulfonium trifluoromethane sulfonate and 4-phenylthiophenyldiphenylsulfonium trifluoroacetate are preferred as triaryl sulfonium salts; tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimido-p-toluenesulfonic acid ester and N-hydroxynaphthalimido-trifluoromethanesulfonic acid ester are preferred as sulfonic acid esters.

What are disclosed by JP-A 4-330444; "Polymer", pp. 242–248, vol. 46, No. 6 (1997) and U.S. Pat. No. 5,627,010 are advantageously used as the above radiation sensitive base generator. However, the radiation sensitive base generator is not limited to these if it generates a base upon exposure to radiation.

The preferred radiation sensitive base generator in the present invention is selected from a photo active carbamate such as triphenyl methanol, benzyl carbamate or benzoin carbamate; amide such as o-carbamoyl hydroxylamide, o-carbamoyloxime, aromatic sulfonamide, alpha-lactam or N-(2-allylethynyl)amide, and other amide; and oxime ester, α-aminoacetophenone and cobalt complex.

Illustrative examples of the radiation sensitive base generator include compounds represented by the following formulas (23) to (33):

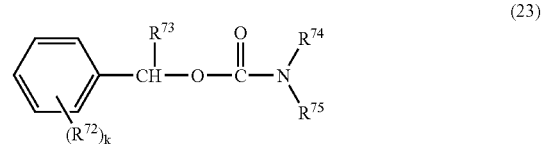

(23)

wherein $R^{72}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, aryl group having 6 to 20 carbon atoms, fluorine atom, chlorine atom or bromine atom, k is an integer of 0 to 3, $R^{73}$ is a hydrogen atom, alkyl group having 1 to 6 carbon atoms, alkenyl group or alkynyl group having 2 to 6 carbon atoms, or aryl group having 6 to 20 carbon atoms, and $R^{74}$ and $R^{75}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{74}$ and $R^{75}$ may be bonded together to form a cyclic structure having 5 to 6 carbon atoms together with a nitrogen atom bonded thereto,

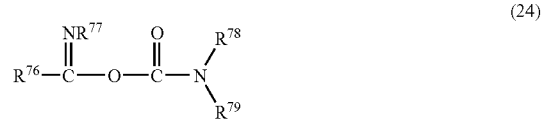

(24)

wherein $R^{76}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{77}$ is a hydrogen atom, alkyl group having 1 to 6 carbon atoms, alkenyl group or alkynyl group having 2 to 6 carbon atoms, or aryl group having 6 to 20 carbon atoms, and $R^{78}$ and $R^{79}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{78}$ and $R^{79}$ may be bonded together to form a cyclic structure having 5 to 6 carbon atoms,

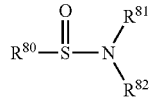
(25)

wherein $R^{80}$ is an alkyl group having 1 to 6 carbon atoms, alkenyl group or alkynyl group having 2 to 6 carbon atoms, or aryl group having 6 to 20 carbon atoms, and $R^{81}$ and $R^{82}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{81}$ and $R^{82}$ may be bonded together to form a cyclic structure having 5 to 6 carbon atoms,

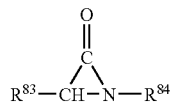
(26)

wherein $R^{83}$ and $R^{84}$ are each independently an alkyl group having 1 to 6 carbon atoms, alkenyl group or alkynyl group having 2 to 6 carbon atoms, or aryl group having 6 to 20 carbon atoms,

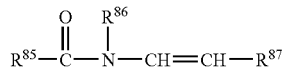
(27)

wherein $R^{85}$, $R^{86}$ and $R^{87}$ are each independently an alkyl group having 1 to 6 carbon atoms, alkenyl group or alkynyl group having 2 to 6 carbon atoms, or aryl group having 6 to 20 carbon atoms,

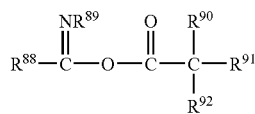
(28)

wherein $R^{88}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{89}$ is a hydrogen atom, alkyl group having 1 to 6 carbon atoms, alkenyl group or alkynyl group having 2 to 6 carbon atoms, or aryl group having 6 to 20 carbon atoms, and $R^{90}$, $R^{91}$ and $R^{92}$ are each independently a hydrogen atom, alkyl group having 1 to 6 carbon atoms, alkenyl group or alkynyl group having 2 to 6 carbon atoms, aryl group having 6 to 20 carbon atoms or benzyl group,

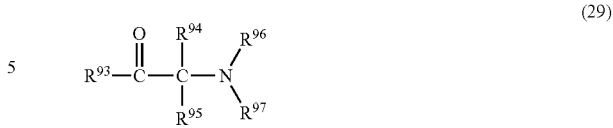
(29)

wherein $R^{93}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{94}$ and $R^{95}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, and $R^{96}$ and $R^{97}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{96}$ and $R^{97}$ may be bonded together to form a cyclic structure having 5 to 6 carbon atoms,

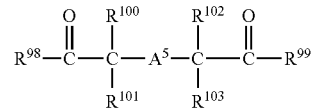
(30)

wherein $R^{98}$ and $R^{99}$ are each independently an alkyl group having 1 to 6 carbon atoms, alkoxyl group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{100}$ to $R^{103}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, and $A^5$ is a divalent atomic group formed by excluding two hydrogen atoms bonded to one or two nitrogen atoms of amonoalkylamine, piperazine, aromatic diamine or aliphatic diamine,

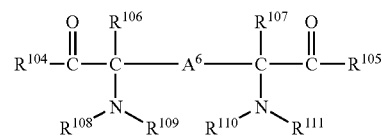
(31)

wherein $R^{104}$ and $R^{105}$ are each independently an alkyl group having 1 to 6 carbon atoms, alkoxyl group having 1 to 6 carbon atoms, thioalkyl group having 1 to 6 carbon atoms, dialkylamino group having 1 to 6 carbon atoms for each alkyl group, piperidyl group, nitro group, hydroxy group, mercapto group, alkenyl group or alkynyl group having 2 to 6 carbon atoms, or aryl group having 6 to 20 carbon atoms, $R^{106}$ and $R^{107}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms, or aryl group having 6 to 20 carbon atoms, $R^{108}$ to $R^{111}$ are each independently a hydrogen atom, alkyl group having 1 to 6 carbon atoms, alkenyl group or alkynyl group having 2 to 6 carbon atoms, aryl group having 6 to 20 carbon atoms or benzyl group, or $R^{108}$ and $R^{109}$, and $R^{110}$ and $R^{111}$ may be bonded together to form a cyclic structure having 5 to 6 carbon atoms, and $A^6$ is an alkylene group having 1 to 6 carbon atoms, cyclohexylene group, phenylene group or single bond,

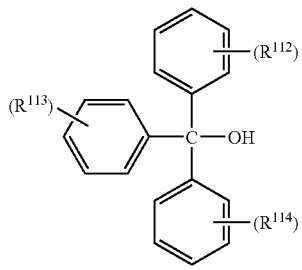

(32)

wherein $R^{112}$ to $R^{114}$ are each independently a hydrogen atom, fluorine atom, chlorine atom, bromine atom, alkyl group having 1 to 6 carbon atoms, alkenyl group having 1 to 6 carbon atoms, alkynyl group having 1 to 6 carbon atoms, alkoxyl group having 1 to 6 carbon atoms, alkenyl group or alkynyl group having 2 to 6 carbon atoms, or aryl group having 6 to 20 carbon atoms, $$L_n CO^{3+}.3[(R^{115})_3 R^{116}]^- \quad (33)$$

wherein L is at least one ligand selected from the group consisting of ammonia, pyridine, imidazole, ethylenediamine, trimethylenediamine, tetramethylenediamine, hexamethylenediamine, propylenediamine, 1,2-cyclohexanediamine, N,N-diethylethylenediamine and diethylenetriamine, n is an integer of 2 to 6, $R^{115}$ is an alkenyl group or alkynyl group having 2 to 6 carbon atoms, or aryl group having 6 to 20 carbon atoms, and $R^{116}$ is an alkyl group having 1 to 18 carbon atoms.

In all the above formulas (23) to (33), the alkyl group may be linear, branched or cyclic. Examples of the alkenyl group include vinyl group and propylenyl group, examples of the alkynyl group include acetylenyl group, and examples of the aryl group include phenyl group, naphthyl group and anthracenyl group. What contain a fluorine atom, chlorine atom, bromine atom, haloalkyl group, hydroxyl group, carboxyl group, mercapto group, cyano group, nitro group, azido group, dialkylamino group, alkoxyl group or thioalkyl group substituted for the hydrogen atoms of the above groups are also included.

Out of these radiation sensitive base generators, preferred are 2-nitrobenzylcyclohexyl carbamate, triphenyl methanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate) and 2-benzyl-2-dimethylamino-1-(4-morpholinophenyl)-butanone.

The above radiation sensitive decomposer (C) is used in an amount of preferably 0.01 part or more by weight, more preferably 0.05 part or more by weight based on 100 parts by weight of the total of the decomposable compound (A) and the nondecomposable component (B) containing an inorganic oxide particle. When the amount of the component (C) is smaller than 0.01 part by weight, sensitivity to radiation may become insufficient. The upper limit value is preferably 30 parts by weight, more preferably 20 parts by weight.

(D) Stabilizer

The stabilizer (D) used in the present invention has the function of stabilizing the residual decomposable compound (A) contained in the dielectric constant changing composition after exposure to radiation to provide stability to an acid or base. This stabilization prevents a change in dielectric constant and hence the deterioration of a dielectric constant pattern formed by the method of the present invention even when it is used under the condition that light having a wavelength close to the wavelength used to change the dielectric constant passes therethrough.

The above stabilizer (D) is selected from an amino compound, epoxy compound, thiirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound (halogenated silyl compound and other silyl compound).

Examples of the above amino compound include ammonia, trimethylamine, triethylamine, tripropylamine, tributylamine, tripentylamine, trihexylamine, tricyclohexylamine, triphenylamine, tribenzylamine, aniline, ethylenediamine, diethylenetriamine, triethylenetetramine, tetraethylenepentamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,4-diaminocyclohexane, 1,3-cyclohexanebis(methylamine), 1,3-propane-2-ol, 2,2',2''-triaminotriethylamine, 1,4-diamino-2,2,3,3-tetrafluoropentane, 1,5-diamino-2,2,3,3,4,4-hexafluoropentane, melamine, benzoguanamine, acetoguanamine, acryloguanamine, paramine, amidol, m-phenylenediamine, p-phenylenediamine, p,p'-diaminodiphenylmethane, diaminodiphenylsulfone, 1,8-diaminonaphthalene, 3,5-diamino-1,2,4-triazole, 2-chloro-4,6-diamino-s-triazine, 2,6-diaminopyridine, 3,3'-diaminobenzidine, bis(4-aminophenyl)ether, m-xylylenediamine, p-xylylenediamine, 1,2,4,5-benzenetetramine, 2,4-diamino-1,3,5-triazine, 4,4'-diaminobenzophenone, 3,3',4,4'-tetraaminobenzophenone, triaminobenzene, 4,4'-thiodianiline, 2,3,5,6-tetrabromo-p-xylylenediamine, 2,3,5,6-tetrachloro-p-xylylenediamine, 4,5-methylenedioxy-1,2-phenylenediamine and 2,2'-bis(5-aminopyridyl)sulfide.

Examples of the above epoxy compound include bisphenol A epoxy resin, bisphenol F epoxy resin, phenol novolak epoxy resin, cresol novolak epoxy resin, cyclic aliphatic epoxy resin, bisphenol A epoxy compound and aliphatic polyglycidyl ether.

Examples of commercially available products of the above compounds are given below. Commercially available products of the bisphenol A epoxy resin include Epicoat 1001, 1002, 1003, 1004, 1007, 1009, 1010 and 828 (of Yuka Shell Epoxy Co., Ltd.), those of the bisphenol F epoxy resin include Epicoat 807 (of Yuka Shell Epoxy Co., Ltd.), those of the phenol novolak epoxy resin include Epicoat 152 and 154 (of Yuka Shell Epoxy Co., Ltd.) and EPPN201 and 202 (of Nippon Kayaku Co., Ltd.), those of the cresol novolak epoxy resin include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.), those of the cyclic aliphatic epoxy resin include CY175, CY177 and CY179 (of CIBA-GEIGY A.G.), ERL-4234, ERL-4299, ERL-4221 and ERL-4206 (of U.C.C. Co., Ltd.), Showdyne 509 (of Showa Denko K.K.), Araldyte CY-182, CY-192 and CY-184 (of CIBA-GEIGY A.G.), Epichlon 200 and 400 (of Dainippon Ink and Chemicals, Inc.), Epicoat 871 and 872 (of Yuka Shell Epoxy Co., Ltd.) and ED-5661 and ED-5662 (of Celanees Coating Co., Ltd.), and those of the aliphatic polyglycidyl ether include Epolite 100MF (of Kyoeisha Kagaku Co., Ltd.) and Epiol TMP (of NOF Corporation).

Besides the above compounds, phenylglycidyl ether, butylglycidyl ether, 3,3,3-trifluoromethylpropylene oxide, styrene oxide, hexafluoropropylene oxide, cyclohexene oxide, N-glycidylphthalimide, (nonafluoro-N-butyl)epoxide, perfluoroethylglycidyl ether, epichlorohydrin, epibromohydrin, N,N-diglycidylaniline and 3-[2-(perfluorohexyl) ethoxy]-1,2-epoxypropane can be advantageously used as an epoxy compound.

Examples of the above thiirane compound include what are obtained by substituting the epoxy groups of the above epoxy compounds with an ethylene sulfide group as shown in J. Org. Chem., 28, 229 (1963), for example.

Examples of the above oxetane compound include bis[(3-ethyl-3-oxetanylmethoxy)methyl]benzene (trade name of XDO, manufactured by Toagosei Chemical Industry Co., Ltd.),.. bis[(3-ethyl-3-oxetanylmethoxy)methyl-phenyl]methane, bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl]hexafluoro propane, tri[(3-ethyl-3-oxetanylmethoxy)methyl]benzene and tetra[(3-ethyl-3-oxetanylmethoxy)methyl]benzene.

The above alkoxymethyl melamine compound, alkoxymethyl benzoguanamine compound, alkoxymethyl glycoluril compound and alkoxymethyl urea compound are obtained by substituting the methylol groups of a methylol melamine compound, methylol benzoguanamine compound, methylol glycoluril compound and methylol urea compound with an alkoxymethyl group, respectively. The type of the alkoxymethyl group is not particularly limited, as exemplified by methoxymethyl group, ethoxymethyl group, propoxymethyl group and butoxymethyl group.

Commercially available products of the above compounds include Simel 300, 301, 303, 370, 325, 327, 701, 266, 267, 238, 1141, 272, 202, 1156, 1158, 1123, 1170 and 1174, and UFR65 and 300 (of Mitsui Sianamid Co., Ltd.), and Nicalak Mx-750, Mx-032, Mx-706, Mx-708, Mx-40, Mx-31, Ms-11 and Mw-30 (of Sanwa Chemical Co., Ltd.).

Examples of the above isocyanate compound include phenylene-1,3-diisocyanate, phenylene-1,4-diisocyanate, 1-methoxyphenylene-2,4-diisocyanate, 1-methylphenylene-2,4-diisocyanate, 2,4-tolylene diisocyanate, 2,6-tolylene diisocyanate, 1,3-xylylene diisocyanate, 1,4-xylylene diisocyanate, biphenylene-4,4'-diisocyanate, 3,3'-dimethoxybiphenylene-4,4'-diisocyanate, 3,3'-dimethylbiphenylene-4,4'-diisocyanate, diphenylmethane-2,4'-diisocyanate, diphenylmethane-4,4'-diisocyanate, 3,3'-dimethoxydiphenylmethane-4,4'-diisocyanate, 3,3'-dimethyldiphenylmethane-4,4'-diisocyanate, naphthylene-1,5-diisocyanate, cyclobutylene-1,3-diisocyanate, cyclopentylene-1,3-diisocyanate, cyclohexylene-1,3-diisocyanate, cyclohexylene-1,4-diisocyanate, 1-methylcyclohexylene-2,4-diisocyanate, 1-methylcyclohexylene-2,6-diisocyanate, 1-isocyanate-3,3,5-trimethyl-5-isocyanate methylcyclohexane, cyclohexane-1,3-bis(methylisocyanate), cyclohexane-1,4-bis(methylisocyanate), isophorone diisocyanate, dicyclohexylmethane-2,4'-diisocyanate, dicyclohexylmethane-4,4'-diisocyanate, ethylene diisocyanate, tetramethylene-1,4-diisocyanate, hexamethylene-1,6-diisocyanate, dodecamethylene-1,12-diisocyanate, lysine diisocyanate methyl ester and prepolymers having an isocyanate group at both terminals obtained from a reaction between a stoichiometrically excessive amount of one of the above organic diisocyanates and a bifunctional active hydrogen-containing compound.

The above diisocyanate may be used in combination with an organic polyisocyanate having 3 or more isocyanate groups, such as phenyl-1,3,5-triisocyanate, diphenylmethane-2,4,4'-triisocyanate, diphenylmethane-2,5,4'-triisocyanate, triphenylmethane-2,4',4"-triisocyanate, triphenylmethane-4,4',4"-triisocyanate, diphenylmethane-2,4,2',4'-tetraisocyanate, diphenylmethane-2,5,2',5'-tetraisocyanate, cyclohexane-1,3,5-triisocyanate, cyclohexane-1,3,5-tris (methylisocyanate), 3,5-dimethylcyclohexane-1,3,5-tris (methylisocyanate), 1,3,5-trimethylcyclohexane-1,3,5-tris (methylisocyanate), dicyclohexylmethane-2,4,2'-triisocyanate, dicyclohexylmethane-2,4,4'-triisocyanate or a prepolymer having an isocyanate group at a terminal obtained from a reaction between a stoichiometrically excessive amount of one of the above organic polyisocyanates having 3 or more isocyanate groups and a polyfunctional active hydrogen-containing compound having 2 or more hydrogen atoms.

Examples of the above cyanate compound include 1,3-dicyanatobenzene, 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 2,2'- or 4,4'-dicyanatobiphenyl, bis(4-cyanatophenyl)methane, 2,2-bis (4-cyanatophenyl)propane, 2,2'-bis(3,5-dichloro-4-cyanatophenyl)propane, 2,2-bis(4-cyanatophenyl)ethane, bis(4-cyanatophenyl)ether, bis(4-cyanatophenyl)thioether, bis(4-cyanatophenyl)sulfone, 1,1,1,3,3,3-hexafluoro-2,2-bis (4-cyanatophenyl)propane, tris(4-cyanatophenyl)phosphite, tris(4-cyanatophenyl)phosphate and benzene polynuclear polyisocyanate compounds obtained from a reaction between a phenolic resin and halogenated cyan (for example, JP-B 45-11712 and JP-B 55-9433) (the term "JP-B" as used herein means an "examined Japanese patent publication"). A divalent cyanic acid ester compound derived from a bisphenol such as 2,2-bis(4-cyanatophenyl) propane is particularly preferred because it is easily acquired and provides excellent moldability and favorable properties to the final cured product. A polycyanato obtained by reacting an initial condensate of a phenol and formaldehyde with halogenated cyan is also useful.

Examples of the above oxazoline compound include 2,2'-bis(2-oxazoline), 4-furan-2-ylmethylene-2-phenyl-4H-oxazol-5-one, 1,4-bis(4,5-dihydro-2-oxazolyl)benzene, 1,3-bis(4,5-dihydro-2-oxazolyl)benzene, 2,3-bis(4-isopropenyl-2-oxazolin-2-yl)butane, 2,2'-bis-4-benzyl-2-oxazoline, 2,6-bis(isopropyl-2-oxazolin-2-yl)pyridine, 2,2'-isopropylidenebis(4-tert-butyl-2-oxazoline), 2,2'- isopropylidenebis(4-phenyl-2-oxazoline), 2,2'-methylenebis(4-tert-butyl-2-oxazoline) and 2,2'-methylenebis(4-phenyl-2-oxazoline).

Examples of the above oxazine compound include 2,2'-bis(2-oxazine), 4-furan-2-ylmethylene-2-phenyl-4H-oxazyl-5-one, 1,4-bis(4,5-dihydro-2-oxazyl)benzene, 1,3-bis(4,5-dihydro-2-oxazyl)benzene, 2,3-bis(4-isopropenyl-2-oxazine-2-yl)butane, 2,2'-bis-4-benzyl-2-oxazine, 2,6-bis(isopropyl-2-oxazine-2-yl)pyridine, 2,2'-isopropylidenebis(4-tert-butyl-2-oxazine), 2,2'-isopropylidenebis(4-phenyl-2-oxazine), 2,2'-methylenebis(4-tert-butyl-2-oxazine) and 2,2'-methylenebis(4-phenyl-2-oxazine).

Examples of the above halogenated silyl compound include tetrahalogenosilanes such as tetrachlorosilane, tetrabromosilane, tetraiodosilane, trichlorobromosilane and dichlorodibromosilane; monoalkyltrihalogenosilanes such as methyltrichlorosilane, methyldichlorobromosilane and cyclohexyltrichlorosilane; monoaryltrihalogenosilanes such as phenyltrichlorosilane, naphthyltrichlorosilane, 4-chlorophenyltrichlorosilane and phenyldichlorobromosilane; monoaryloxytrihalogenosilanes such as phenoxytrichlorosilane and phenoxydichlorobromosilane; monoalkoxytrihalogenosilanes such as methoxytrichlorosilane and ethoxytrichlorosilane; dialkyldihalogenosilanes such as dimethyldichlorosilane, methyl(ethyl)dichlorosilane and methyl(cyclohexyl)dichlorosilane; monoalkylmonoaryldihalogenosilanes such as methyl(phenyl)dichlorosilane; diaryldihalogenosilanes such as diphenyldichlorosilane; diaryloxydihalogenosilanes such as diphenoxydichlorosilane; monoalkylmonoaryloxydihalogenosilanes such as methyl(phenoxy)dichlorosilane; monoarylmonoaryloxydihalogenosilanes such as phenyl(phenoxy)dichlorosilane; dialkoxydihalogenosilanes such as diethoxydichlorosilane; monoalkylmonoalkoxydichlorosilanes such as methyl(ethoxy)dichlorosilane; monoarylmonoethoxydichlorosilanes such as phenyl(ethoxy)dichlorosilane; trialkylmonohalogenosilanes such as trimethylchlorosilane, dimethyl(ethyl)chlorosilane and dimethyl(cyclohexyl)chlorosilane; dialkylmonoarylmonohalogenosilanes such as dimethyl(phenyl)chlorosilane; monoalkyldiarylmonohalogenosilanes such as methyl(diphenyl)chlorosilane; triaryloxymonohalogenosilanes such as triphenoxychlorosilane; monoalkyldiaryloxymonohalogenosilanes such as methyl(diphenoxy)chlorosilane; monoaryldiaryloxymonohalogenosilanes such as phenyl(diphenoxy)chlorosilane; dialkylmonoaryloxymonohalogenosilanes such as dimethyl(phenoxy)chlorosilane; diarylmonoaryloxymonohalogenosilanes such as diphenyl(phenoxy)chlorosilane; monoalkylmonoarylmonoaryloxymonohalgenosilanes such as methyl(phenyl)(phenoxy)chlorosilane; triethoxymonohalogenosilanes such as triethoxychlorosilane; and oligomers of the above compounds such as dimers, trimers, tetramers and pentamers of tetrachlorosilane.

Examples of the above other silyl compound include hexamethyldisilazane, t-butyldimethylchlorosilane, bis(trimethylsilyl)trifluoroacetamide, diethylaminotrimethylsilane, trimethylsilanol, hexamethyldisiloxane, chloromethyldimethylethoxysilane, acetyltriphenylsilane, ethoxytriphenylsilane, triphenylsilanol, triethylsilanol, tripropylsilanol, tributylsilanol, hexaethyldisiloxane, trimethylmethoxysilane, trimethylethoxysilane, triethylmethoxysilane, triethylethoxysilane, acetoxyethyldimethylchlorosilane, 1,3-bis(hydroxybutyl)tetramethyldisiloxane, 1,3-bis(hydroxypropyl)tetramethyldisiloxane, γ-aminopropylmethoxysilane, γ-aminopropylethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, γ-anilinopropyltrimethoxysilane, γ-dibutylaminopropyltrimethoxysilane, γ-ureidopropyltriethoxysilane, N-β(N-vinylbenzylaminoethyl)-γ-aminopropyltrimethoxysilane.hydrochlorate, γ-methacryloxypropyltrimethoxysilane, γ-methacryloxypropyltriethoxysilane, vinyltrimethoxysilane, vinyltriethoxysilane, vinyltrichlorosilane, vinyltris(β-methoxyethoxy)silane, γ-glycidoxypropylmethyldiethoxysilane, γ-glycidoxypropyltriethoxysilane, γ-(3,4-epoxycyclohexyl)ethyltrimethoxysilane, γ-glycidoxypropyltrimethoxysilane, γ-mercaptopropyltrimethoxysilane, γ-chloropropyltrimethoxysilane, trimethylchlorosilane, hexamethyldisilazane, N-trimethylsilylimidazole, bis(trimethylsilyl)urea, trimethylsilylacetamide, bistrimethylsilylacetamide, trimethylsilylisocyanate, trimethylmethoxysilane, trimethylethoxysilane, methyltrimethoxysilane, methyltriethoxysilane, dimethyldimethoxysilane, dimethyldiethoxysilane, t-butyldimethylchlorosilane, t-butyldiphenylchlorosilane, triisopropylchlorosilane, n-propyltrimethoxysilane, isobutyltrimethoxysilane, n-hexyltrimethoxysilane, n-decyltrimethoxysilane, n-hexadecyltrimethoxysilane, 1,6-bis(trimethoxysilyl)hexane, dimethylsilyldiisocyanate, methylsilyltriisocyanate, phenyltrimethoxysilane, diphenyldimethoxysilane and phenylsilyltriisocyanate.

Out of these, the stabilizer (D) used in the present invention is preferably an amino compound, epoxy compound, thiirane compound, oxetane compound, oxazoline compound, oxazine compound, silyl compound, isocyanate compound or cyanate compound, more preferably an amino compound, epoxy compound, thiirane compound, oxetane compound, oxazoline compound or oxazine compound. It is particularly preferably ethylenediamine, phenylglycidyl ether, 3-phenoxypropylene sulfide, 3,3,3-trifluoropropylene oxide, hexamethyldisilazane, γ-aminopropylmethoxysilane, γ-glycidoxypropyltrimethoxysilane or methylsilyltriisocyanate.

These stabilizers (D) may be used alone or in combination of two or more. The amount of the component (D) may be excessive so that the residual decomposable compound (A) can react to the full but it is generally 10 parts or more by weight, preferably 30 parts or more by weight based on 100 parts by weight of the component (A). When the amount of the component (D) is smaller than 10 parts by weight, the stability of the dielectric constant changing material may become unsatisfactory due to an incomplete reaction.

A catalyst may be used in combination with the stabilizer (D). Use of the catalyst promotes a reaction between the component (D) and the residual decomposable compound (A).

The catalyst is, for example, an acid catalyst, basic catalyst or quaternary onium salt.

Examples of the above acid catalyst include organic acids such as acetic acid, methanesulfonic acid, p-toluenesulfonic acid, trifluoroacetic acid and trifluoromethanesulfonic acid; and inorganic acids such as hydrochloric acid, sulfuric acid and nitric acid. Examples of the above basic catalyst include alkali metal carbonates such as sodium carbonate, potassium carbonate and lithium carbonate; alkali metal bicarbonates such as sodium bicarbonate, potassium bicarbonate and lithium bicarbonate; alkali metal acetates such as sodium acetate; alkali metal hydrides such as lithium hydride, sodium hydride and potassium hydride; alkali metal hydroxides such as sodium hydroxide, potassium hydroxide and lithium hydroxide; alkali metal alkoxides such as sodium methoxide, sodium ethoxide, potassium t-butoxide and lithium methoxide; mercaptan alkali metals such as methyl mercaptan sodium and ethyl mercaptan sodium; organic amines such as triethylamine, tributylamine, diisopropylethylamine, N-methylmorpholine, pyridine, 4-(N,N-dimethylamino)pyridine, N,N-dimethylaniline, N,N-diethylaniline, 1,5-diazabicyclo[4.3.0]non-5-ene, 1,4-diazabicyclo[2.2.2]octane (DABCO) and 1,8-diazabicyclo[5.4.0]undec-7-ene (DBU); alkyl lithiums such as methyl lithium, ethyl lithium and butyl lithium; and lithium alkyl amides such as lithium diisopropylamide and lithium dicyclohexylamide. Examples of the above quaternary onium salt include tetrabutylammonium chloride, tetrabutylammonium bromide, tetrabutylammonium iodide, tetrabutylammonium acetate, tetrabutylphosphonium chloride, tetrabutylphosphonium bromide, cetyltrimethylammonium bromide, tetrapropylammonium bromide and benzyltriethylammonium chloride. A combination of 18-crown-6-ether and a salt such as potassium chloride, potassium bromide, potassium iodide, cesium chloride, potassium phenoxide, sodium phenoxide or potassium benzoate may also be used as a catalyst.

Out of these, p-toluenesulfonic acid, hydrochloric acid, sulfuric acid, sodium hydroxide, potassium t-butoxide, triethylamine, DBU, tetrabutylammonium bromide, tetrabutylphosphonium bromide and 18-crown-6-ether/potassium phenoxide are preferred as a catalyst.

The amount of the catalyst is preferably 2 mols or less based on 1 equivalent of the component (D) when an amino compound, alkoxymethyl melamine compound, alkoxymethyl glycoluril compound, alkoxymethyl benzoguanamine compound, alkoxymethyl urea compound or halogenated silyl compound is used as the component (D).

When an epoxy compound, thiirane compound, oxetane compound, isocyanate compound, cyanate compound, oxazoline compound, oxazine compound or other silyl compound is used as the component (D), the amount of the catalyst is preferably 0.2 mol or less based on 1 equivalent of the component (D).

The number of equivalents of the component (D) is obtained by multiplying the number of reactive groups contained in the component (D) by the amount (mol) of the component (D), and the number of reactive groups is defined as follows according to the type of the component (D). amino compound: number of nitrogen atoms epoxy compound: number of epoxy groups thiirane compound: number of ethylene sulfide groups oxetane compound: number of oxetanyl groups alkoxymethyl melamine compound, alkoxymethyl glycoluril compound, alkoxymethyl benzoguanamine compound and alkoxymethyl urea compound: number of alkoxymethyl groups isocyanate compound: number of isocyanate groups cyanate compound: number of cyanate groups oxazoline compound: number of oxazolyl groups oxazine compound: number of oxazyl groups halogenated silyl compound: number of halogen atoms bonded to silicon atoms other silyl compound: number of silicon atoms <Other Components>

The dielectric constant changing composition used in the present invention may contain other additives in limits not prejudicial to the object of the present invention. The additives include an ultraviolet light absorber, sensitizer, surfactant, heat resistance improving agent and adhesive aid.

The above ultraviolet light absorber is selected from a benzotriazole, salicylate, benzophenone, substituted acrylonitrile, xanthene, coumarin, flavone and chalcone. Specific examples of the ultraviolet light absorber include Tinubin 234 (2-(2-hydroxy-3,5-bis(α,α-dimethylbenzyl)phenyl)-2H-benzotriazole), Tinubin 571 (hydroxyphenylbenzotriazole derivative) and Tinubin 1130 (condensate of methyl-3-(3-t-butyl-5-(2H-benzotriazol-2-yl)-4-hydroxyphenyl) propionate and polyethylene glycol (molecular weight of 300)) (of Ciba Specialty Chemicals Co., Ltd.), 1,7-bis(4-hydroxy-3-methoxyphenyl)-1,6-heptadien-3,5-dione, and dibenzylidene acetone.

By adding an ultraviolet light absorber, the amount of an acid or base formed from the component (C) can be made gradually smaller as the depth from the surface of an exposed portion of the dielectric constant changing composition of the present invention increases. The amount of the ultraviolet light absorber is preferably 30 parts or less by weight, more preferably 20 parts or less by weight based on 100 parts by weight of the total of the components (A) and (B).

The above sensitizer is selected from a coumarin having a substituent at the 3-position and/or 7-position, flavone, dibenzalacetone, dibenzalcyclohexane, chalcone, xanthene, thioxanthene, porphyrin, phthalocyanine, acridine and anthracene.

The amount of the sensitizer is preferably 30 parts or less by weight, more preferably 20 parts or less by weight based on 100 parts by weight of the total of the components (A) and (B).

The above surfactant may be added to improve coatability, for example, prevent striation, and improve developability.

Examples of the surfactant include nonionic surfactants such as polyoxyethylene alkyl ethers including polyoxyethylene lauryl ether, polyoxyethylene stearyl ether and polyoxyethylene oleyl ether, polyoxyethylene aryl ethers including polyoxyethylene octylphenyl ether and polyoxyethylene nonylphenyl ether, and polyethylene glycol dialkyl esters including polyethylene glycol dilaurate and polyethylene glycol distearate; fluoro-based surfactants commercially available under the trade names of F Top EF301, EF303 and EF352 (of Shin Akita Kasei Co., Ltd.), Megafac F171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); and other surfactants commercially available under the trade names of organosiloxane polymer KP341 (of Shin-Etsu Chemical Co., Ltd.) and acrylic or methacrylic acid-based (co)polymer Polyflow No. 57 and No. 95 (of Kyoeisha Kagaku Co., Ltd.).

The amount of the surfactant is preferably 2 parts or less by weight, more preferably 1 part or less by weight based on 100 parts by weight of the total of the components (A) and (B).

The above adhesive aid may be added to improve adhesion to a substrate and is preferably a silane coupling agent.

The above heat resistance improving agent is an unsaturated compound such as a polyvalent acrylate.

An antistatic agent, keeping stabilizer, halation inhibitor, anti-foaming agent, pigment and thermal acid generator may be further added to the dielectric constant changing material used in the present invention, as required.

<Formation of Dielectric Constant Pattern>

In the present invention, a dielectric constant pattern can be formed from the above dielectric constant changing composition as follows, for example.

First, the dielectric constant changing composition is dissolved or dispersed in a solvent to prepare a composition solution having a solid content of 5 to 70 wt %. The composition solution may be filtered with a filter having an opening diameter of about 0.1 to 10 μm as required before use.

Thereafter, this composition solution is applied to the surface of a substrate such as a silicon wafer and prebaked to remove the solvent so as to form the coating film of the dielectric constant changing composition. Part of the formed coating film is then exposed to radiation through a pattern mask and heated to form pores in the exposed portion of the coating film and solidify the film so as to produce a dielectric constant difference between the exposed and unexposed portions of the dielectric constant changing composition.

An acid or base is formed from the radiation sensitive decomposer (C) by the above exposure to act on the component (A) to decompose it. When this decomposed product is gaseous at normal temperature, it dissipates at the time of heating after exposure to form pores.

When the decomposed product is liquid or solid at normal temperature, it is vaporized or sublimated as a gas by heating at a temperature raised at the time of heating to be dissipated so as to form pores, or only the decomposed product is extracted to form pores. As a result, there is produced a dielectric constant difference between the exposed and unexposed portions.

When the component (D) to be reacted with the residual component (A) which did not react with an acid or base is not existent at the time of heating, heating is further carried out to decompose the residual component (A). Heating is preferably carried out in such a manner that pores are not formed by the decomposed product.

When the component (D) is existent at the time of heating, the residual component (A) which did not react with the acid or base reacts with the component (D) to stabilize the formed dielectric constant pattern.

The solvent used to prepare a solution containing the dielectric constant changing composition used in the present invention uniformly dissolves the above components (A), (B) and (C), the optionally added component (D) and other additives and does not react with these components.

Illustrative examples of the solvent include alcohols such as methanol, ethanol, propanol, iso-propanol, butanol, ethylene glycol and propylene glycol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether and diethylene glycol ethyl methyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate; and fluorine atom-containing solvents such as trifluoromethylbenzene, 1,3-bis(trifluoromethyl)benzene, hexafluorobenzene, hexafluorocyclohexane, perfluorodimethylcyclohexane, perfluoromethylcyclohexane, octafluorodecaline and 1,1,2-trichloro-1,2,2-trifluoroethane.

Out of these solvents, alcohols, glycol ethers, ethylene glycol alkyl ether acetates, propylene glycol alkyl ether acetates, ketones, esters and diethylene glycols are preferred from the viewpoints of solubility, reactivity with each component and ease of forming a coating film.

Further, a high-boiling solvent may be used in combination with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The dielectric constant changing composition used in the present invention is formed into various shapes in consideration of application purpose before exposure to radiation. For example, it is formed like a rod, fiber, long board, sphere, film or lens and the present invention is not limited to these. A commonly used molding technique may be used, as exemplified by injection molding, compression molding, blow molding, extrusion, in-case frame polymerization, shaving, drawing, heating/cooling, CVD deposition, sintering and scanning. Spin coating, slitting, bar coating, solvent casting, LB, spraying, roll coating, relief-printing or screen printing may also be used according to the application purpose of an optically molded product.

In this molding process, heating (to be referred to as "prebaking" hereinafter) is preferably carried out. The heating condition which changes according to the composition of the material of the present invention and the type of each additive is preferably 30 to 200° C., more preferably 40 to 150° C. A hot plate or oven, or infrared radiation may be used for heating.

The radiation used for exposure is an i-line having a wavelength of 365 nm, h-line having a wavelength of 404 nm, g-line having a wavelength of 436 nm, ultraviolet radiation from a wide-range wavelength light source such as a xenon lamp, far ultraviolet radiation such as KrF excimer laser beam having a wavelength of 248 nm or ArF excimer laser beam having a wavelength of 193 nm, X-radiation such as synchrotron radiation, charged corpuscular beam such as electron beam, visible radiation or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. The projection of the radiation through a pattern mask makes possible the patterning of the radiation sensitive dielectric constant changing material. As for patterning accuracy which is affected by a light source used, a dielectric constant pattern having a dielectric constant variation distribution with a resolution of about 0.2 μm can be produced.

In the present invention, heating (to be referred to as "post-exposure baking (PEB)") is preferably carried out after exposure. A similar device to the above prebaking device may be used for PEB and PEB conditions may be arbitrary. The heating temperature is preferably 30 to 150° C., more preferably 30 to 130° C. Heating is preferably carried out for stabilization, that is, a reaction between the residual component (A) and the component (D) successively after post-exposure baking or separately. The heating temperature for stabilization is preferably 35 to 200° C., more preferably a temperature 10° C. or more higher than the PEB temperature, much more preferably a temperature 20° C. or more higher than the PEB temperature.

Further, re-exposure may be carried out to decompose the residual component (C) existent in the unexposed portion and further improve the stability of the material.

The re-exposure may be carried out by applying radiation having the same wavelength as the radiation used to change the dielectric constant to the entire surface of the pattern in the same amount.

Optionally, heating may be further carried out to further improve the stability of the material. A similar device to the prebaking device used at the time of molding the material may be used for heating and the heating conditions may be arbitrary.

According to the present invention, the method of forming a dielectric constant pattern of the present invention may also be carried out by exposing a dielectric constant changing composition comprising the above components (A), (B) and (C) to radiation through a pattern mask and then treating it with the stabilizer (D).

The treatment with the stabilizer (D) is preferably carried out after post-exposure baking.

The stabilizer (D) has the function of stabilizing the residual decomposable compound (A) contained in the dielectric constant changing material after exposure to provide stability to an acid or base. This stabilization prevents a change in dielectric constant and hence the deterioration of a dielectric constant pattern formed by the method of the present invention even when it is used under the condition that light having a wavelength close to the wavelength used to change the dielectric constant passes therethrough.

Besides the above examples, a low-boiling compound such as ammonia or triethylamine may be used as the stabilizer (D).

For contact between the dielectric constant changing material after exposure to radiation and the stabilizer (D) for stabilization, a suitable method may be employed. For instance, the component (D) and optionally a catalyst are dissolved in a suitable solvent to be contacted to the dielectric constant changing material as a solution. Alternatively, when the component (D) is liquid or gaseous under contact conditions, it may be 100% directly contacted to the dielectric constant changing material.

When a solvent is used in the reaction between the above stabilizer (D) and the component (A), the solvent preferably dissolves the component (D) and an optionally added catalyst and does not dissolve the component (A). If the above solvent is selected, the surface of the obtained dielectric constant pattern will not be roughened.

Examples of the solvent include water; alcohols such as methanol, ethanol, iso-propanol, n-propanol, n-butanol, iso-butanol, tert-butanol, cyclohexanol, ethylene glycol, propylene glycol and diethylene glycol; ethers such as diethyl ether and tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether and propylene glycol ethyl ether; propylene glycol alkyl ether acetates such as propylene glycol methyl ether acetate and propylene glycol ethyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; aliphatic hydrocarbons such as n-hexane, n-heptane and n-octane; ketones such as methyl ethyl ketone, cyclohexanone, methyl isobutyl ketone, methylamyl ketone and 4-hydroxy-4-methyl-2-pentanone; esters such as ethyl acetate, propyl acetate, butyl acetate, ethyl 2-hydroxypropionate, methyl 2-hydroxy-2-methylpropionate, ethyl hydroxyacetate, butyl hydroxyacetate, ethyl lactate, propyl lactate, butyl lactate, methyl 3-hydroxypropionate, methyl 2-hydroxy-3-methylbutanoate, ethyl methoxyacetate, butyl methoxyacetate, ethyl 2-methoxypropionate, butyl 2-methoxypropionate, butyl 2-ethoxypropionate, butyl 2-butoxypropionate, butyl 3-methoxypropionate, butyl 3-ethoxypropionate, butyl 3-propoxypropionate and butyl 3-butoxypropionate; and fluorine atom-containing solvents such as trifluoromethylbenzene, 1,3-bis(trifluoromethyl)benzene, hexafluorobenzene, hexafluorocyclohexane, perfluorodimethylcyclohexane, perfluoromethylcyclohexane, octafluorodecalin and 1,1,2-trichloro-1,2,2-trifluoroethane.

Out of these solvents, water, alcohols, glycol ethers, ethylene glycol alkyl ether acetates and fluorine atom-containing solvents are preferred.

The reaction temperature for carrying out a reaction between the stabilizer (D) and the residual decomposable compound (A) is generally 0 to 130° C., and the reaction time is generally 10 seconds to 1 hour.

Further, re-exposure may be carried out to decompose the residual component (C) existent in the unexposed portion and further improve the stability of the material.

As for which is not described of the dielectric constant pattern forming method including the above stabilization, it should be understood that what is described of the above dielectric constant pattern forming method is applied directly or with modifications obvious to one of ordinary skill in the art.

Further, according to the present invention, the dielectric constant pattern forming method of the present invention may also be carried out by exposing a dielectric constant changing composition comprising the above components (A), (B) and (C) to radiation through a pattern and heating it to decompose the decomposable compound in the unexposed portion.

The above heating is preferably carried out at a temperature 10° C. or more higher than the post-exposure baking temperature, for example, 170° C. or higher, more preferably 200° C. or higher.

The residual decomposable compound (A) existent in the unexposed portion is decomposed or sublimated by heating to be removed but it preferably does not form pores substantially.

As for what is not described of the above dielectric constant pattern forming method when the component (D) is not contained, it should be understood that relevant items out of what is described of the above pattern forming method are applied directly or with modifications obvious to one of ordinary skill in the art.

In the dielectric constant pattern of the present invention formed as described above, the dielectric constant of the exposed portion is preferably lower than the dielectric constant of the unexposed portion. More preferably, the dielectric constant of the exposed portion is 90% or less, preferably 75% or less of the dielectric constant of the unexposed portion.

The porosity of the exposed portion is preferably 10 to 99.9%, more preferably 15 to 99.9%, particularly preferably 20 to 99.9%.

Further, the elastic moduli of the exposed portion and the unexposed portion are preferably 0.3 GPa or more and 1 GPa or more, more preferably 0.5 GPa or more and 3 GPa or more, respectively.

As described above, the composition of the present invention is formed into a film and a pattern consisting of a plurality of regions having different dielectric constants can be formed. Therefore, when a film whose necessary portion has a low dielectric constant is used as an insulating material for a circuit board, the strength of the film can be greatly made higher than a conventional organic insulating material having a low dielectric constant and pores on whole of the film.

The composition of the present invention can be suitably used as an interlayer insulating film between multi-layer wiring patterns.

Further, the dielectric constant pattern formed from the composition of the present invention can be used as a capacitor and also as an input/output capacitor or path capacitor to be mounted on an LSI having built-in passive elements or a substrate having built-in passive elements. When the composition of the present invention is used as a capacitor, the capacitor can be made lighter and thinner than a capacitor made from a conventionally known material and can have a desired shape, thereby making it possible to increase the capacity per volume and the degree of freedom in the design of an array when passive elements are disposed in an array.

EXAMPLES

The following examples are provided for the purpose of further illustrating the present invention but are in no way to be taken as limiting.

In the following examples, the weight average molecular weight in terms of polystyrene of each compound was measured with the GPC CHROMATOGRAPH SYSTEM-21 of Showa Denko K.K.

Synthesis Examples of Component (A)

Synthesis Example 1 of Component (A)

49.84 g of terephthalic acid and 57.34 g of phenylmethyldichlorosilane were dissolved in 200 g of N-methylpyrrolidone in a 500 ml three-necked flask in an argon atmosphere. A solution prepared by dissolving 23.73 g of pyridine in 50 g of N-methylpyrrolidone was added to the above solution under agitation and cooling with ice over 1 hour. After addition, the reaction solution was heated at 60° C. to carry out polymerization for 24 hours. After the end of polymerization, the reaction solution was poured into 2 liters of methanol to precipitate a polymer which was then dissolved in 200 ml of N-methylpyrrolidone and added to 2 liters of methanol for purification by re-precipitation.

The precipitated compound was separated by filtration and dried under vacuum at 50° C. to obtain 70.80 g of a compound (A-1). The weight average molecular weight of the obtained compound was 26,000.

Synthesis Example 2 of Component (A)

50 g of o-phthalaldehyde and 500 g of tetrahydrofuran as monomers were fed to a 1 liter flask the inside of which was then substituted by nitrogen and cooled to −78° C. 41.83 g of tert-butoxypotassium was added to the mixture and stirred under cooling at −78° C. in a nitrogen atmosphere for 48 hours.

45.67 g of acetic anhydride and 35.38 g of pyridine were added to the obtained reaction solution under cooling and stirred at −78° C. for 2 hours. The reaction solution was concentrated to 100 ml by heating at 60° C. under reduced pressure, dissolved in 1 liter of ethyl acetate and washed with ion exchange water three times, ethyl acetate was concentrated, and the reaction solution was vacuum dried at 50° C. to obtain 45 g of a compound (A-2). It was found from $^1$H-NMR that the ratio of a t-butyl group derived from tert-butoxypotassium to an aromatic group derived from o-phthalaldehyde was 1:1 based on the integral ratio of a proton derived from 1.2 to 1.3 ppm of a tert-butyl group to a proton derived from 7.2 to 7.7 ppm of an aromatic group.

Synthesis Example 3 of Component (A)

49.84 g of terephthalic acid chloride was dissolved in 150 ml of chloroform in a 500 ml three-necked flask in an argon atmosphere, and a solution prepared by dissolving 33.05 g of 1,4-benzenethiol and 16.83 g of potassium hydroxide in 150 ml of ion exchange water was added to the above obtained solution and stirred to carry out interfacial polycondensation. After 4 hours of the reaction, the reaction product was purified by re-precipitation with tetrahydrofuran-methanol twice.

The precipitated compound was separated by filtration and vacuum dried at 50° C. to obtain 56.55 g of a compound (A-3). The weight average molecular weigh of the obtained compound was 7,600.

Synthesis Example 4 of Component (A)

8 g of 2,2'-azobis(2,4-dimethylvaleronitrile) and 200 g of diethylene glycol dimethyl ether were fed to a 500 ml three-necked flask. After 100 g of tert-butyl methacrylate was fed to the flask and the inside of the flask was substituted by nitrogen, stirring was started gently. The temperature of the solution was raised to 90° C. and maintained at that temperature for 3 hours to obtain a solution of a polymer (A-4). The solid content of the obtained polymer solution was 31.0 wt % and the weight average molecular weight of the polymer was 5,500.

Synthesis Examples of Component (B)

Synthesis Example 1 of Component (B)

50 g of methyltrimethoxysilane was placed in a 1 liter three-necked flask, 100 g of 1-ethoxy-2-propanol was added to the flask to be dissolved, and the obtained mixed solution was heated at 60° C. under agitation with a magnetic stirrer. 19.85 g of ion exchange water was added to this continuously over 1 hour. A reaction was carried out at 60° C. for 4 hours, and the obtained reaction solution was cooled to room temperature.

Thereafter, methanol which was a reaction by-product was distilled off from the reaction solution under reduced pressure, and the residue was concentrated to a solid content of 20 wt % to obtain a solution containing a compound. (B-1). The weight average molecular weight of the compound (B-1) was 2,200.

Synthesis Example 2 of Component (B)

200 g of tetrabutoxytitanium was dissolved in anhydrous toluene in a 1 liter three-necked flask to prepare a solution which was then heated at 85° C. A mixed solution of 20.1 g of ion exchange water and 400 g of n-butyl alcohol was added dropwise to this solution at 85° C. over 1 hour. After the end of addition, the resulting solution was further heated at 85° C. for 3 hours under agitation. The thus obtained reaction solution was heated at 150° C. under reduced pressure (0.1 mmHg) to distill off a volatile component. Subsequently, 500 g of 1-ethoxy-2-propanol was added to the reaction solution which was then concentrated to a solid content of 20 wt % to obtain a solution containing a compound (B-1). The weight average molecular weight of this compound (B-2) was 2,200.

Example 1

50 parts by weight of the compound (A-1) as the component (A), a solution containing the compound (B-1) (corresponding to 50 parts by weight (solid content) of the compound (B-1)) as the component (B) and 1 part by weight of 4-phenylthiophenyldiphenylsulfonium trifluoromethanesulfonato as the component (C) were dissolved in diethylene glycol ethyl methyl ether to a total solid content of 20 wt %, and the resulting solution was filtered with a membrane filter having an opening diameter of 0.2 μm to prepare a solution of a dielectric constant changing material.

(1) Formation of a Coating Film

The above solution was applied to a silicon substrate with a spinner and prebaked on a hot plate at 130° C. for 2 minutes to form a 1.0 μm-thick coating film.

(2) Formation of a Dielectric Constant Pattern

The coating film obtained as described above was exposed to 50 mJ/cm$^2$ of radiation with the NSR1505i6A reduction projection exposure device (of Nikon Corporation, NA=0.45, λ=365 nm) at the optimum focusing depth. The coating film was then baked at 100° C. for 2 minutes after exposure to form a dielectric constant pattern having a dielectric constant difference between exposed and unexposed portions. A portion exposed to radiation of the dielectric constant pattern formed herein will be referred to as "exposed portion" and a portion unexposed to radiation will be referred to as "unexposed portion" hereinafter.

(3) Stabilization 150 ml of phenyl glycidyl ether (containing 0.1 mmol of tetrabutylammonium bromide as a reaction catalyst) as the component (D) was heated at 100° C., and the dielectric constant patterns formed on a silicon substrate and a glass substrate formed as described above were immersed in the component (D) at 100° C. for 2 minutes and rinsed with super pure water for 1 minute.

Then, the entire surfaces of the patterns were re-exposed to 4.5 mW/cm$^2$ of radiation using the Canon PLA-501F for 1 minute without a filter and heated in an oven at 200° C. for 10 minutes to stabilize the dielectric constant patterns.

(4) Measurement of Surface Area by BET Method

The surface areas of the exposed portion and unexposed portion of the dielectric constant pattern formed as described above were measured by a BET method using the OMNISORP 100/360 SERIES of COULTER Co., Ltd.

(5) Measurement of Porosity by Mercury Porosimeter

The porosities of the exposed portion and unexposed portion of the dielectric constant pattern formed as described above were measured by a mercury porosimeter (Auto Pore 9200 of Shimadzu Corporation having a minimum measurable pore dieter of 34 Å).

(6) Measurement of Pore Distribution by BJH Method

The pore distributions of the exposed and unexposed portions of the dielectric constant pattern formed as described above were measured by a BJH method using the OMNISORP 100/360 SERIES of COULTER Co., Ltd. The number of pores having a diameter of 100 nm or more per 1 mm$^3$ is shown in Table 2.

(7) Measurement of Pore Diameter by Observation through Electron Microscope

The number of pores having a diameter of 100 nm or more per 10 μm$^2$ in an arbitrary observation range was counted in the measurement of pore distributions of the exposed and unexposed portions of the dielectric constant pattern formed above by observation through a transmission electron microscope.

(8) Measurement of Refractive Index

The refractive indices of the exposed and unexposed portions of the dielectric constant pattern formed above were measured by the Auto EL IV NIR III elipsometer (of Rudolf Research Co., Ltd.) at 633 nm. The results are shown in Table 1.

(9) Elastic Modulus (Young's Modulus)

This was measured by a continuous stiffness measuring method using the Nano Indenter XP (of Nano Instrument Co., Ltd.).

(10) Dielectric Constant

An aluminum electrode pattern was formed on the obtained film by a deposition method to prepare a sample for the measurement of dielectric constant. The sample was used for the measurement of the dielectric constant of the coating film by a CV method at a frequency of 100 kHz using the HP16451B electrode and HP4284A precision LCR meter of Yokagawa Hewlett Packard Co., Ltd.

Example 2

Evaluations were carried out in the same manner as in Example 1 except that 50 parts by weight of the compound (A-2) was used as the component (A), the post-exposure baking temperature in the step (2) (formation of dielectric constant pattern) was changed as shown in Table 1, and the type of the component (D) and the stabilization temperature in the step (3) (stabilization) were changed as shown in Table 2. The results are shown in Table 1 and Table 2.

Example 3

Evaluations were carried out in the same manner as in Example 1 except that 50 parts by weight of the compound (A-3) was used as the component (A), 5 parts by weight of N-(2-nitrobenzyloxycaronyl)pyrrolidine was used as the component (C), the dosage of radiation in step (2) (formation of dielectric constant pattern) was changed as shown in Table 1, and the type of the component (D) in the step (3) (stabilization) was changed as shown in Table 2. The results are shown in Table 1 and Table 2.

Example 4

Evaluations were carried out in the same manner as in Example 1 except that a solution containing the compound (B-2) (corresponding to 50 parts by weight (solid content) of the compound (B-2)) was used as the component (B). The results are shown in Table 1 and Table 2.

Example 5

Evaluations were carried out in the same manner as in Example 1 except that 50 parts by weight of the compound (A-4) was used as the component (A), the post-exposure baking temperature in the step (2) (formation of dielectric constant pattern) was changed as shown in Table 1, the coating film was immersed in a 2.38% aqueous solution of tetramethylammonium hydroxide for 1 minute before stabilization to extract the component A, and the type of the component (D) and the stabilization temperature in the step (3) (stabilization) were changed as shown in Table 2. The results are shown in Table 1 and Table 2.

Example 6

The procedure of Example 1 was repeated up to the step (2) (formation of dielectric constant pattern) and then baking was carried out at 200° C. for 5 minutes without stabilization and further at 350° C. for 1 hour. The steps (4) to (10) were the same as in Example 1. The results are shown in Table 1 and Table 2.

TABLE 1

| | Conditions for forming a dielectric constant pattern | | | |
|---|---|---|---|---|
| | | Post-exposure | Stabilization conditions | |
| | Dosage (mJ/cm$^2$) | baking temperature (° C.) | Type of component (D) | Temperature |
| Ex. 1 | 80 | 100 | D-1 | 80 |
| Ex. 2 | 60 | 100 | D-2 | 20 |
| Ex. 3 | 100 | 100 | D-1 | 80 |
| Ex. 4 | 100 | 100 | D-1 | 80 |
| Ex. 5 | 80 | 150 | D-1 | 80 |
| Ex. 6 | 80 | 100 | none | 80 |

Ex. = Example

In Table 1, symbols for the component (D) indicate the following.
D-1; phenylglycidyl ether (containing 10 mol % of tetrabutylammonium bromide)
D-2; 1% aqueous solution of p-xylylenediamine

TABLE 2

| | Surface area | | Porosity | | Number of pores having a diameter of 100 nm or more in exposed portion | |
|---|---|---|---|---|---|---|
| | Exposed portion | Unexposed portion | Exposed portion | Unexposed portion | BJH method | Observation through electron microscope |
| Ex. 1 | 510 m$^2$/g | —$^{1)}$ | 28% | 0% | 0 | 0 |
| Ex. 2 | 700 m$^2$/g | —$^{1)}$ | 38% | 0% | 0 | 0 |
| Ex. 3 | 450 m$^2$/g | —$^{1)}$ | 22% | 0% | 0 | 0 |
| Ex. 4 | 450 m$^2$/g | —$^{1)}$ | 21% | 0% | 0 | 0 |
| Ex. 5 | 500 m$^2$/g | —$^{1)}$ | 25% | 0% | 0 | 0 |
| Ex. 6 | 520 m$^2$/g | —$^{1)}$ | 28% | 0% | 0 | 0 |

| | Refractive index | | Elastic modulus | | Dielectric constant | |
|---|---|---|---|---|---|---|
| | Exposed portion | Unexposed portion | Exposed portion | Unexposed portion | Exposed portion | Unexposed portion |
| Ex. 1 | 1.31 | 1.54 | 2.3 GPa | 6.9 GPa | 2.3 | 4.0 |
| Ex. 2 | 1.27 | 1.54 | 1.5 GPa | 6.6 GPa | 2.1 | 4.3 |
| Ex. 3 | 1.33 | 1.58 | 2.9 GPa | 7.5 GPa | 2.4 | 4.0 |
| Ex. 4 | 1.80 | 1.85 | 2.6 GPa | 8.8 GPa | 50.0 | 75.1 |

TABLE 2-continued

| Ex. 5 | 1.33 | 1.45 | 2.4 GPa | 6.4 GPa | 2.4 | 3.7 |
| Ex. 6 | 1.25 | 1.41 | 1.2 GPa | 5.1 GPa | 1.9 | 3.0 |

Ex. = 2 Example
[1] not detectable due to measurement limits

Devices and capacitors having excellent interlayer insulating film characteristics could be manufactured using the dielectric constant patterns obtained in the above Examples 1 to 6.

Since the dielectric constant pattern formed by the method of the present invention has a sufficiently large dielectric constant difference and this dielectric constant difference is stable to light and heat, the dielectric constant pattern is extremely useful as an interlayer insulating film material for use in optoelectronic and display fields. The dielectric constant pattern of the present invention is used as a material to be packaged, such as a capacitor.

The invention claimed is:

1. A radiation sensitive dielectric constant changing composition, comprising:

(A) an acid decomposable compound which contains at least one of compounds having at least one of structures represented by the following formulas (1) to (6) and (10):

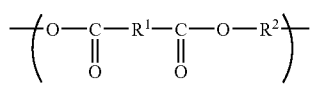

wherein $R^1$ is an alkylene group, alkylene-arylene-alkylene group or arylene group, and $R^2$ is an alkylene group, alkylene-arylene-alkylene group, arylene group, alkylsilylene group or alkylgermylene group,

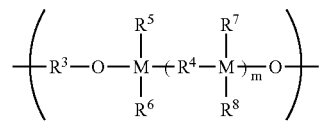

wherein M is Si or Ge, $R^3$ is an alkylene group, alkylene-arylene-alkylene group, arylene group, alkylsilylene group or alkylgermylene group, $R^4$ is an oxygen atom, alkylene group, alkylene-arylene-alkylene group, arylene group or single bond, $R^5$, $R^6$, $R^7$ and $R^8$ are each independently a hydrogen atom, alkyl group, aryl group, alkoxyl group or thioalkyl group, and m is an integer of 0 to 2,

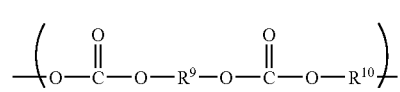

wherein $R^9$ and $R^{10}$ are each independently an alkylene group, alkylene-arylene-alkylene group, arylene group, alkylsilylene group or alkylgermylene group,

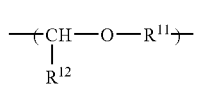

wherein $R^{11}$ is an oxyalkylene group or single bond, and $R^{12}$ is a hydrogen atom, alkyl group, alkylene-arylene-alkylene group or aryl group,

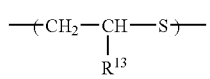

wherein $R^{13}$ is a hydrogen atom, alkyl group or aryl group,

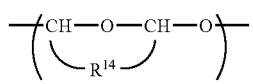

wherein $R^{14}$ is an alkylene group or a structure represented by the following formula (7), (8) or (9),

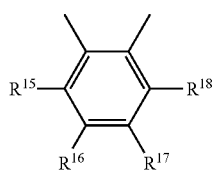

wherein $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having to 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms,

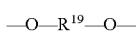

wherein $R^{19}$ is an alkylene group,

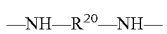

wherein $R^{20}$ is an alkylene group,

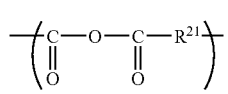

wherein $R^{21}$ is an alkylene group, alkylene-arylene-alkylene group or arylene group, (B) an acid nondecomposable compound, (C) a radiation sensitive decomposer which is a radiation sensitive acid generator, and optionally (D) a stabilizer, wherein the amount of said nondecomposable compound (B) is 5 to 90 parts by weight based on 100 parts by weight of the total of said decomposable compound (A) and said nondecomposable compound (B).

2. The composition of claim 1, wherein the dielectric constant of a portion exposed to radiation is 90% or less of the dielectric constant of an unexposed portion.

3. The composition of claim 1 or 2, wherein the stabilizer (D) is at least one selected from the group consisting of an amino compound, epoxy compound, thiirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound.

4. The composition of claim 1, which comprises the stabilizer (D) and further comprises a catalyst for a reaction between the decomposable compound (A) and the stabilizer (D).

5. The composition of claim 1, wherein the amount of said nondecomposable compound (B) is 10 to 70 parts by weight based on 100 parts by weight of the total of said decomposable compound (A) and said nondecomposable compound (B).

6. A radiation sensitive dielectric constant changing composition, comprising:

(A) a base decomposable compound, which contains at least one of compounds having at least one of structures represented by the following formulas (11) to (13) and (14):

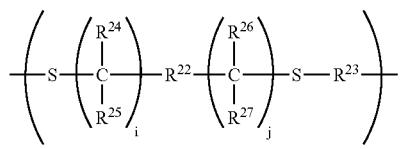

wherein $R^{22}$ is an alkylene group, aralkylene group or arylene group, $R^{23}$ is an alkylene group, aralkylene group, arylene group, alkylene-arylene-alkylene group, alkylsilylene group or alkylgermylene group, $R^{24}$, $R^{21}$, $R^{26}$ and $R^{27}$ are each independently a hydrogen atom, alkyl group, aryl group, alkoxyl group or thioalkyl group, and i and j are each independently 0 or 1,

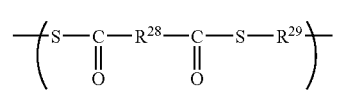

wherein $R^{28}$ is an alkylene group, aralkylene group or arylene group, and $R^{29}$ is an alkylene group, aralkylene group, arylene group, alkylene-arylene-alkylene group, alkylsilylene group or alkylgermylene group,

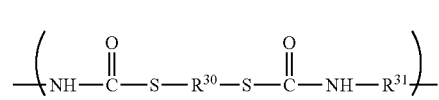

wherein $R^{30}$ and $R^{31}$ are each independently an alkylene group, aralkylene group, arylene group, alkylene-arylene-alkylene group, alkylsilylene group of alkylgermylene group, wherein $R^{32}$ and $R^{33}$ are each independently an alkylene group, aralkylene group, arylene group, alkylene-arylene-alkylene group, alkylsilylene group or alkylgermylene group, (B) a base nondecomposable compound, (C) a radiation sensitive decomposer, which is a radiation sensitive base generator, and optionally (D) a stabilizer, wherein the amount of said nondecomposable compound (B) is 5 to 90 parts by weight based on 100 parts by weight of the total of said decomposable compound (A) and said nondecomposable compound (B).

7. The composition of claim 6, wherein the dielectric constant of a portion exposed to radiation is 90% or less of the dielectric constant of an unexposed portion.

8. The composition of claim 6 or 7, wherein the stabilizer (D) is at least one selected from the group consisting of an amino compound, epoxy compound, thiirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound.

9. The composition of claim 6, which comprises the stabilizer (D) and further comprises a catalyst for a reaction between the decomposable compound (A) and the stabilizer (D).

10. The composition of claim 6, wherein the amount of said nondecomposable compound (B) is 10 to 70 parts by weight based on 100 parts by weight of the total of said decomposable compound (A) and said nondecomposable compound (B).

* * * * *